(12) United States Patent
Pedoeem et al.

(10) Patent No.: US 11,910,542 B2
(45) Date of Patent: Feb. 20, 2024

(54) SYSTEM FOR JOINING ELECTRONIC EQUIPMENT HOUSINGS TOGETHER IN A RACK APPARATUS

(71) Applicant: Crestron Electronics, Inc., Rockleigh, NJ (US)

(72) Inventors: Albert Pedoeem, Rockleigh, NJ (US); David Paolazzi, Rockleigh, NJ (US); Gregory Sorrentino, Rockleigh, NJ (US)

(73) Assignee: CRESTRON ELECTONICS, INC., Rockleigh, NJ (US)

(*) Notice: Subject to any disclaimer, the term of this patent is extended or adjusted under 35 U.S.C. 154(b) by 276 days.

(21) Appl. No.: 17/017,559

(22) Filed: Sep. 10, 2020

(65) Prior Publication Data

US 2020/0413552 A1   Dec. 31, 2020

Related U.S. Application Data

(62) Division of application No. 15/605,007, filed on May 25, 2017, now Pat. No. 10,779,420.

(Continued)

(51) Int. Cl.
  *H05K 5/00* (2006.01)
(52) U.S. Cl.
  CPC ........ *H05K 5/0021* (2013.01); *A47B 2230/01* (2013.01); *A47B 2230/16* (2013.01); *Y10T 403/61* (2015.01)
(58) Field of Classification Search
  CPC .. Y10T 403/61; H05K 5/0021; H05K 7/1487; E04B 2002/025; A47B 2230/16; A47B 2230/14; A47B 2230/01

(Continued)

(56) References Cited

U.S. PATENT DOCUMENTS

| | | | | |
|---|---|---|---|---|
| 1,444,996 A | * | 2/1923 | Anderson | F16B 12/20 248/475.1 |
| 2,632,535 A | * | 3/1953 | Clerk | E06B 3/9765 403/295 |

(Continued)

FOREIGN PATENT DOCUMENTS

| | | | | |
|---|---|---|---|---|
| CA | 2269433 A1 | * | 10/2000 | E06B 7/086 |
| CN | 108112199 A | * | 6/2018 | H05K 5/0021 |

(Continued)

*Primary Examiner* — Michael Safavi
(74) *Attorney, Agent, or Firm* — CRESTRON ELECTRONIC

(57) ABSTRACT

Described herein are systems, modes, and methods for mounting one or more electronic housings to each other and to a rack mount system, a table mount system, or wall mount system. The mounting system includes a first pair of matching sliding panels that interface with each other in a slidingly engaging manner. Each of the first pair of sliding panels can be mounted to housings prior to being engaged with each other; the engagement of the first pair of sliding panels removably fixes the two housings together; additional housings can be fixed to the first two in a substantially similar manner. The first pair of sliding panels includes a U-shaped sliding panel and a C-shaped sliding panel, and according to a second embodiment, a second pair of sliding panels includes a C-shaped sliding panel and a Pi-shaped sliding panel. The second pair of sliding panels operates in a substantially similar manner as the first pair of sliding panels.

9 Claims, 25 Drawing Sheets

Related U.S. Application Data

(60) Provisional application No. 62/345,093, filed on Jun. 3, 2016.

(58) Field of Classification Search
USPC .... 403/331, 335, 354, 363; 52/582.1, 592.2, 52/592.3
See application file for complete search history.

(56) References Cited

U.S. PATENT DOCUMENTS

| | | | | |
|---|---|---|---|---|
| 3,011,235 A * | 12/1961 | Pacheco | ............... | F16B 7/0493 172/776 |
| 3,547,472 A * | 12/1970 | Ehrman | ............. | A47B 47/0041 403/381 |
| 3,552,817 A * | 1/1971 | Marcolongo | .......... | A47B 87/02 312/107 |
| 3,589,755 A * | 6/1971 | King | ................... | E04B 2/7448 52/584.1 |
| 3,887,289 A * | 6/1975 | Smart | ............... | G03B 15/0421 248/223.41 |
| 4,132,335 A * | 1/1979 | Ingram | ................... | B60R 9/045 D8/382 |
| 4,512,680 A * | 4/1985 | Tomaszewski | ....... | F16B 7/0426 403/313 |
| 4,516,874 A * | 5/1985 | Yang | ....................... | F16B 5/126 403/313 |
| 4,645,228 A * | 2/1987 | Bertonneau | ............. | A63C 5/02 403/DIG. 15 |
| 4,652,170 A * | 3/1987 | Lew | ....................... | F16B 12/02 403/171 |
| 4,845,916 A * | 7/1989 | Villard | ..................... | G09F 7/00 428/33 |
| 5,343,666 A * | 9/1994 | Haddad | ............... | B62D 27/026 52/848 |
| 5,405,017 A * | 4/1995 | Szabo, Sr. | ................. | A47F 7/30 211/175 |
| 5,439,268 A * | 8/1995 | Dozsa-Farkas | ...... | A47C 1/0307 248/118.5 |
| 5,476,699 A * | 12/1995 | Hurvitz | ................... | H05K 5/04 403/375 |
| 5,524,394 A * | 6/1996 | Szabo, Sr. | ................. | A47F 5/10 403/381 |
| 5,666,713 A * | 9/1997 | Kubota | ............. | A47B 87/0276 312/111 |
| 5,692,722 A * | 12/1997 | Lundagårds | ........ | E05B 73/0082 248/500 |
| 5,803,653 A * | 9/1998 | Zuffetti | ..................... | E04C 3/07 52/645 |
| 6,032,590 A * | 3/2000 | Chen | ........................ | A47B 3/12 403/381 |
| 6,234,707 B1 * | 5/2001 | Maier-Hunke | ........ | F16B 5/0032 403/339 |
| 6,250,843 B1 * | 6/2001 | Olson | ................... | A47B 87/008 403/381 |
| 9,510,678 B2 * | 12/2016 | Aleisa | ................ | A47B 47/0091 |
| 10,128,612 B1 * | 11/2018 | Casto | .................... | H01R 13/17 |
| 2003/0196404 A1 * | 10/2003 | Dennis | ................... | E04B 1/043 52/582.1 |
| 2006/0261015 A1 * | 11/2006 | Blackwell | ........... | H05K 5/0021 211/26 |
| 2009/0304440 A1 * | 12/2009 | Wang | ....................... | E06B 1/18 403/252 |
| 2012/0206876 A1 * | 8/2012 | Chen | ................... | H05K 5/0021 361/679.58 |
| 2013/0208420 A1 * | 8/2013 | Franklin | ............. | H05K 7/1488 211/183 |
| 2016/0029506 A1 * | 1/2016 | Franklin | ............. | H05K 5/0021 211/26 |
| 2021/0076524 A1 * | 3/2021 | Bala | ..................... | H05K 5/0008 |

FOREIGN PATENT DOCUMENTS

| | | | | |
|---|---|---|---|---|
| CN | 112412936 A | * | 2/2021 | ............... F16B 21/00 |
| DE | 1139998 B | * | 11/1962 | ........... H05K 5/0021 |
| DE | 9401567 U1 | * | 5/1994 | ........... H05K 5/0021 |
| DE | 4322631 A1 | * | 1/1995 | ............... E04B 9/10 |
| DE | 202014101849 U1 | * | 8/2015 | ........... H05K 5/0021 |
| DE | 102016206162 B4 | * | 5/2018 | |
| EP | 1091380 A1 | * | 4/2001 | ......... H01H 85/2045 |
| EP | 1220398 A2 | * | 7/2002 | ............. F16L 3/222 |
| FR | 2639410 A1 | * | 5/1990 | |
| FR | 2742004 A1 | * | 6/1997 | ......... H01R 13/514 |
| GB | 2357380 A | * | 6/2001 | ................ H02J 1/00 |
| GB | 2558219 A | * | 7/2018 | ........ A47B 47/0025 |
| JP | 04046210 A | * | 2/1992 | |
| KR | 20030021331 A | * | 3/2003 | ........ A47B 47/0041 |
| KR | 20030066263 A | * | 8/2003 | ......... A47B 2230/01 |
| WO | WO-9419553 A1 | * | 9/1994 | ............ E04B 1/615 |
| WO | WO-2004067972 A1 | * | 8/2004 | ............... B23K 1/58 |
| WO | WO-2021121629 A1 | * | 6/2021 | ........... G01D 11/245 |

* cited by examiner

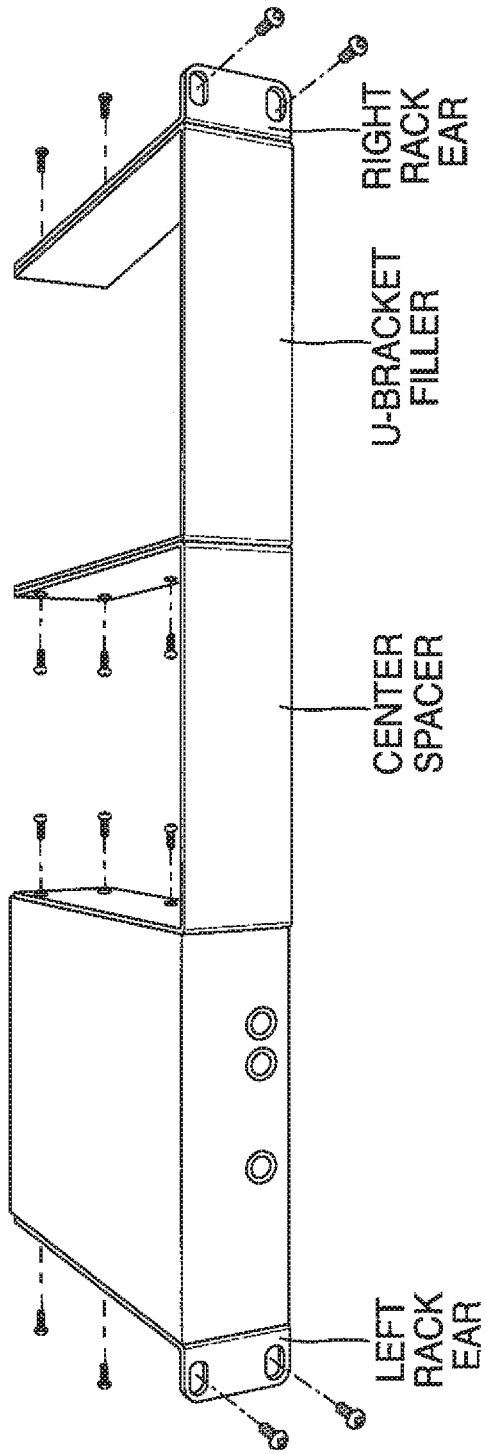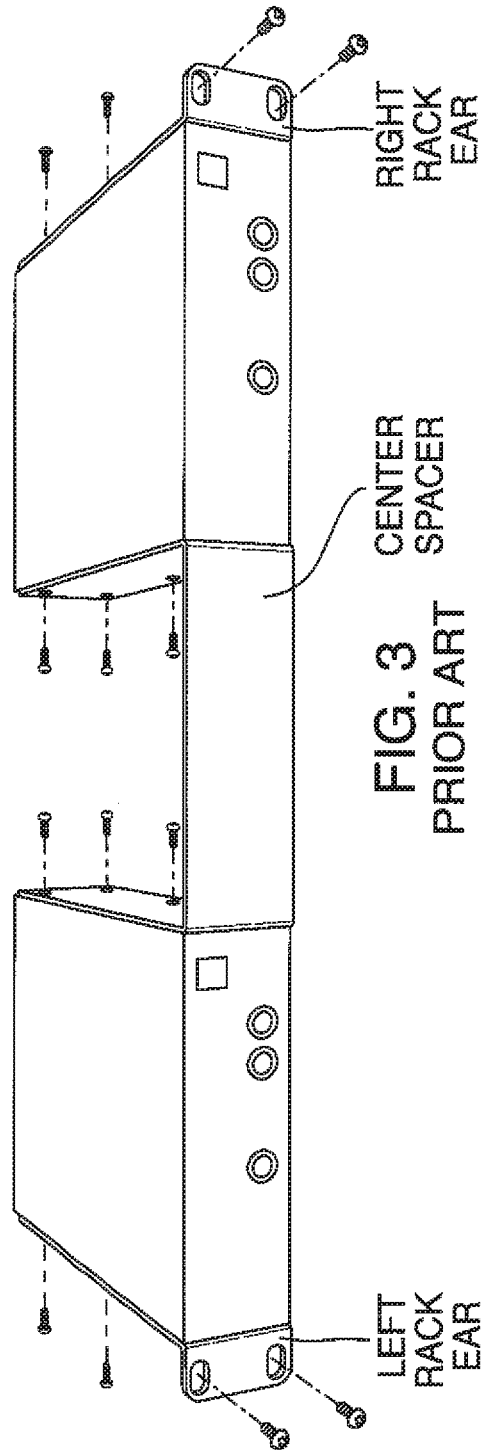
FIG. 2
PRIOR ART
FIG. 3
PRIOR ART

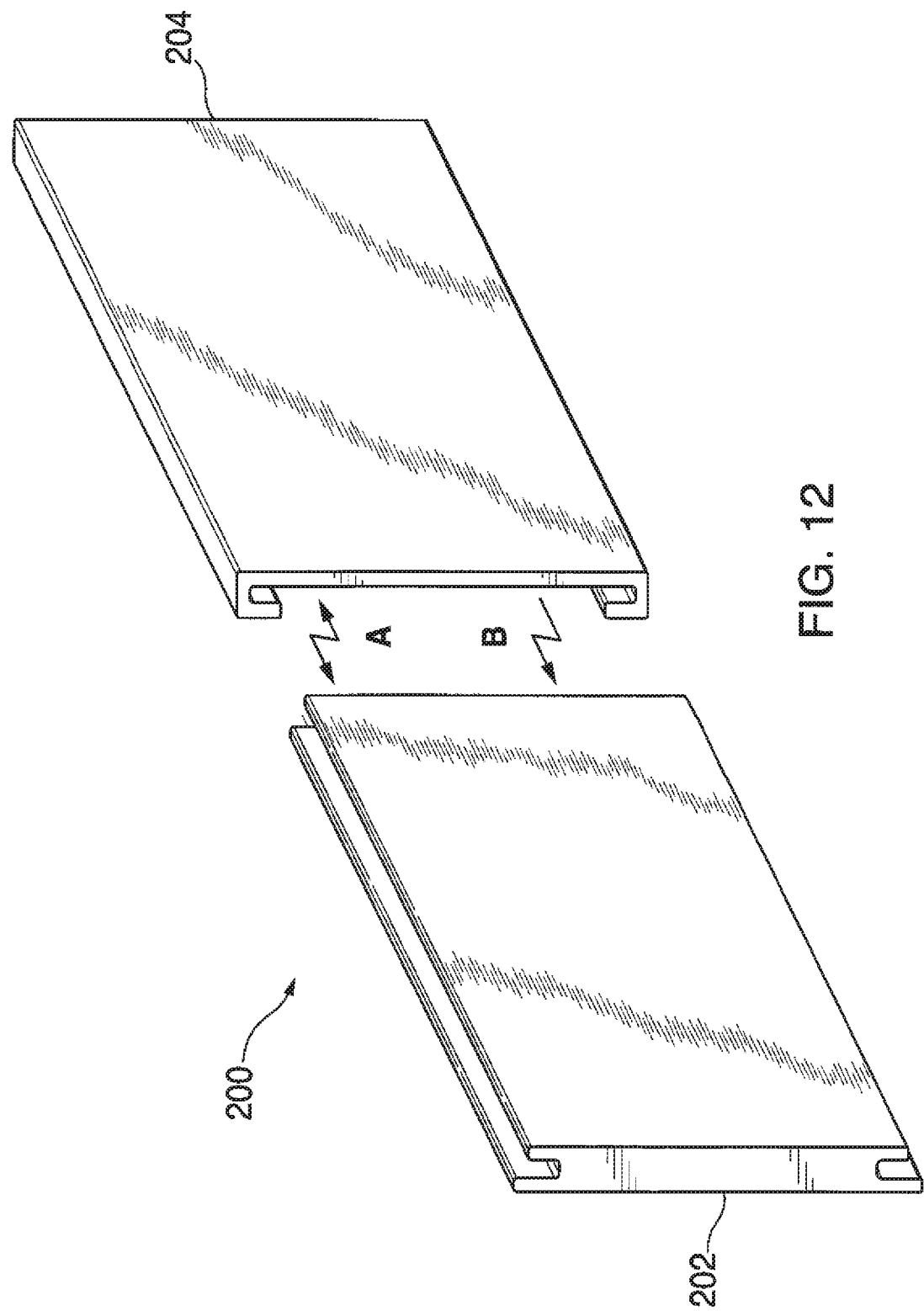

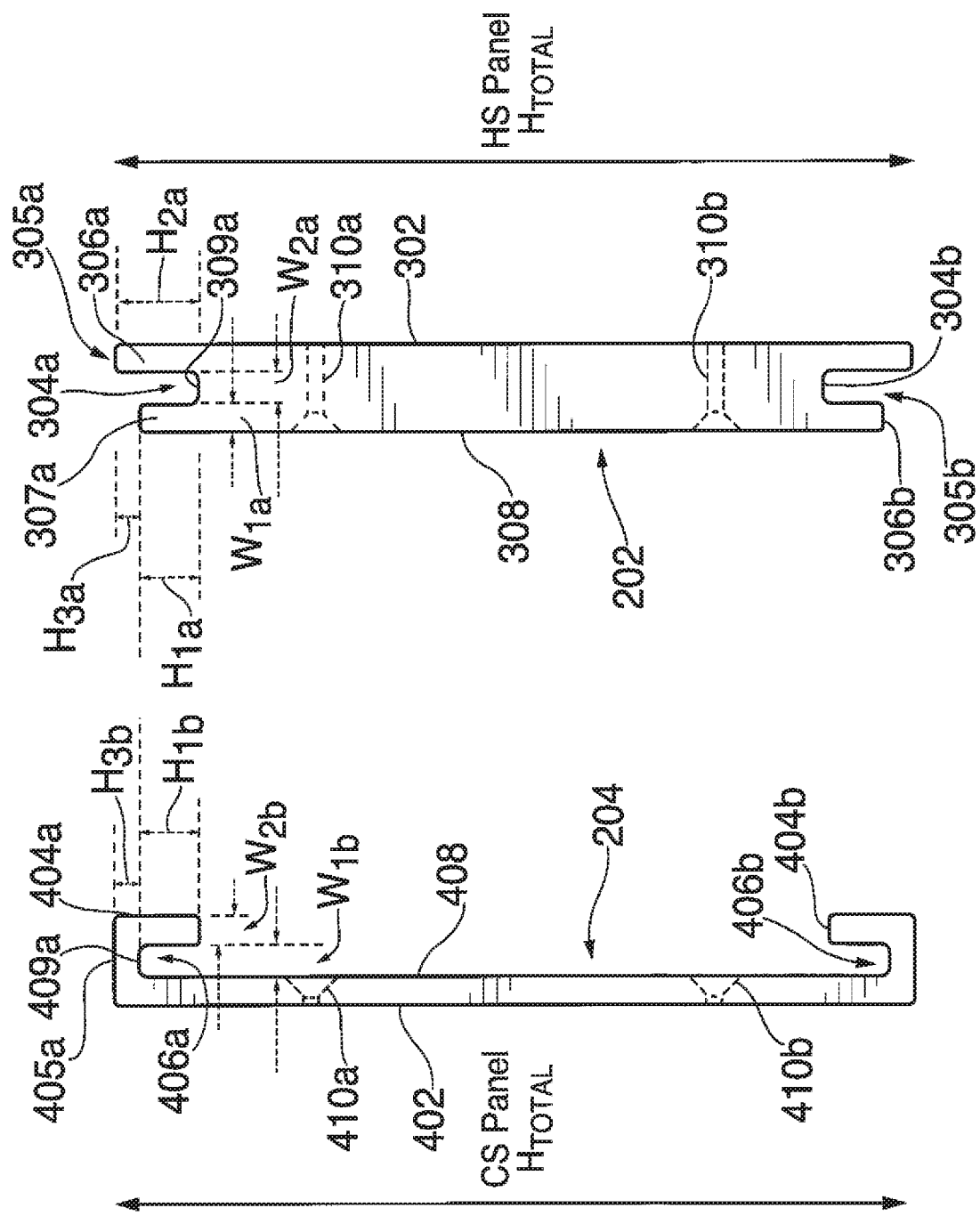

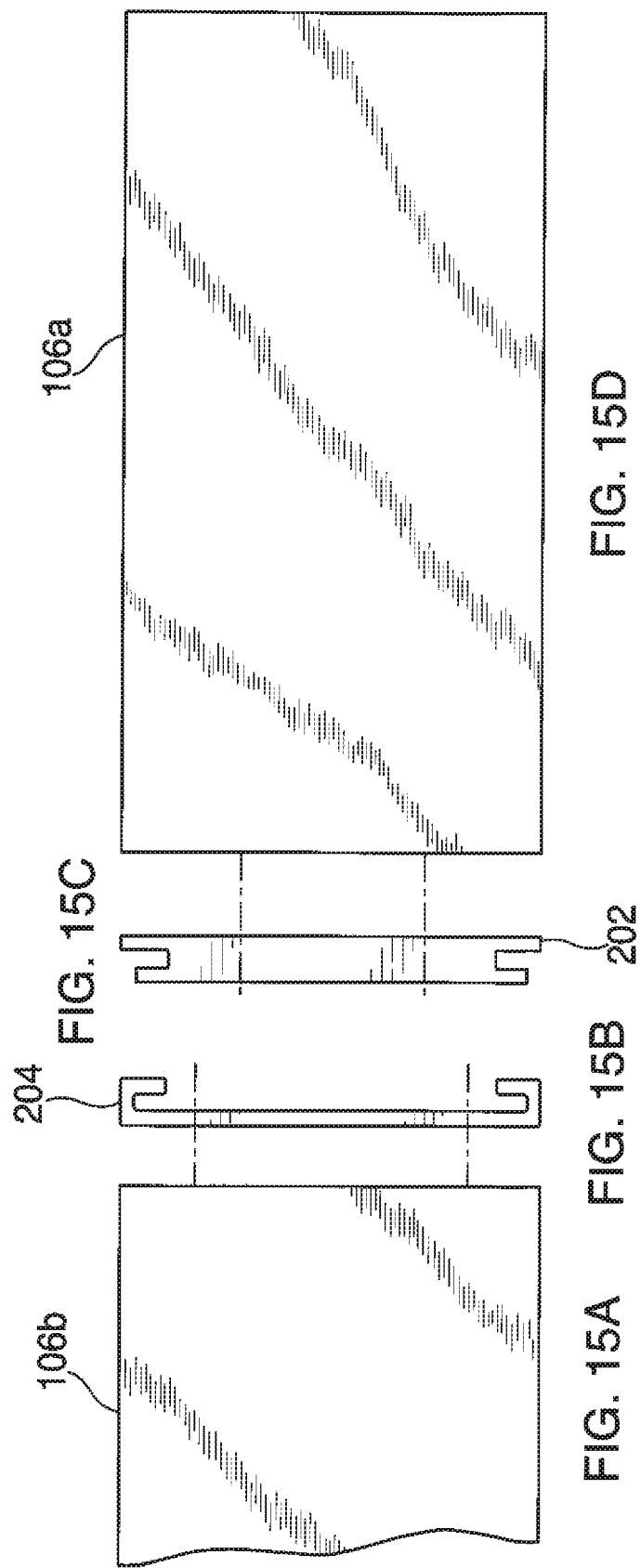

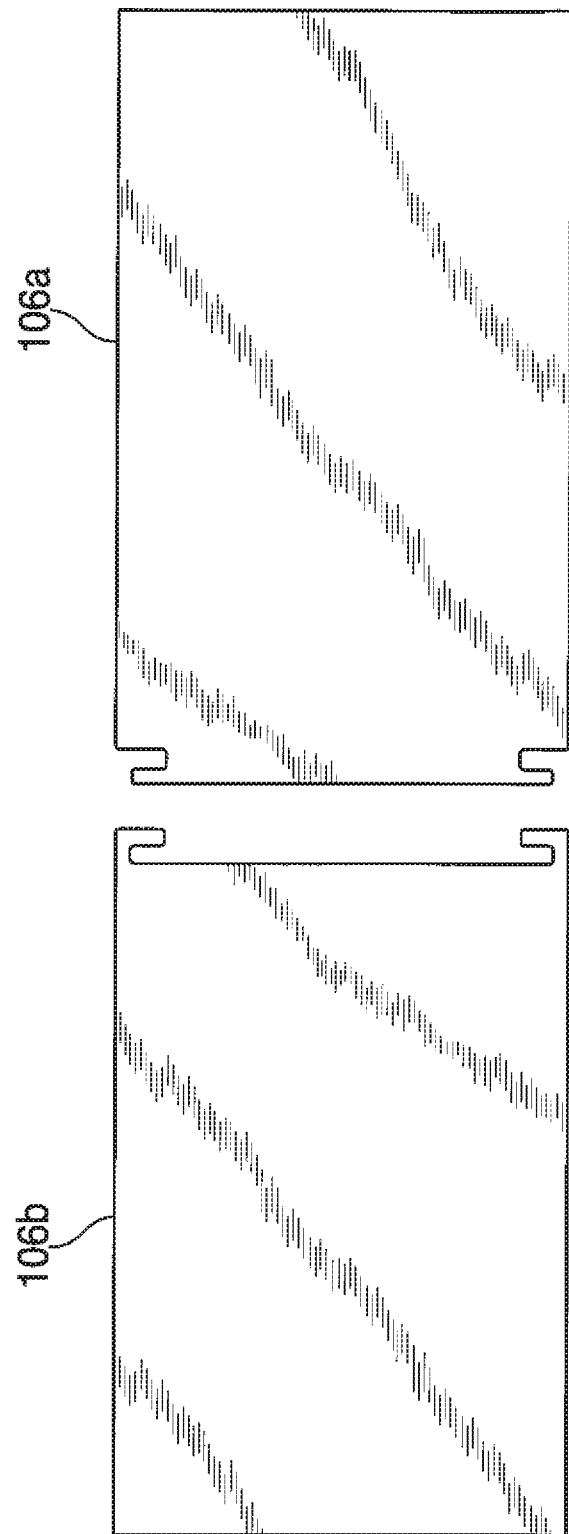

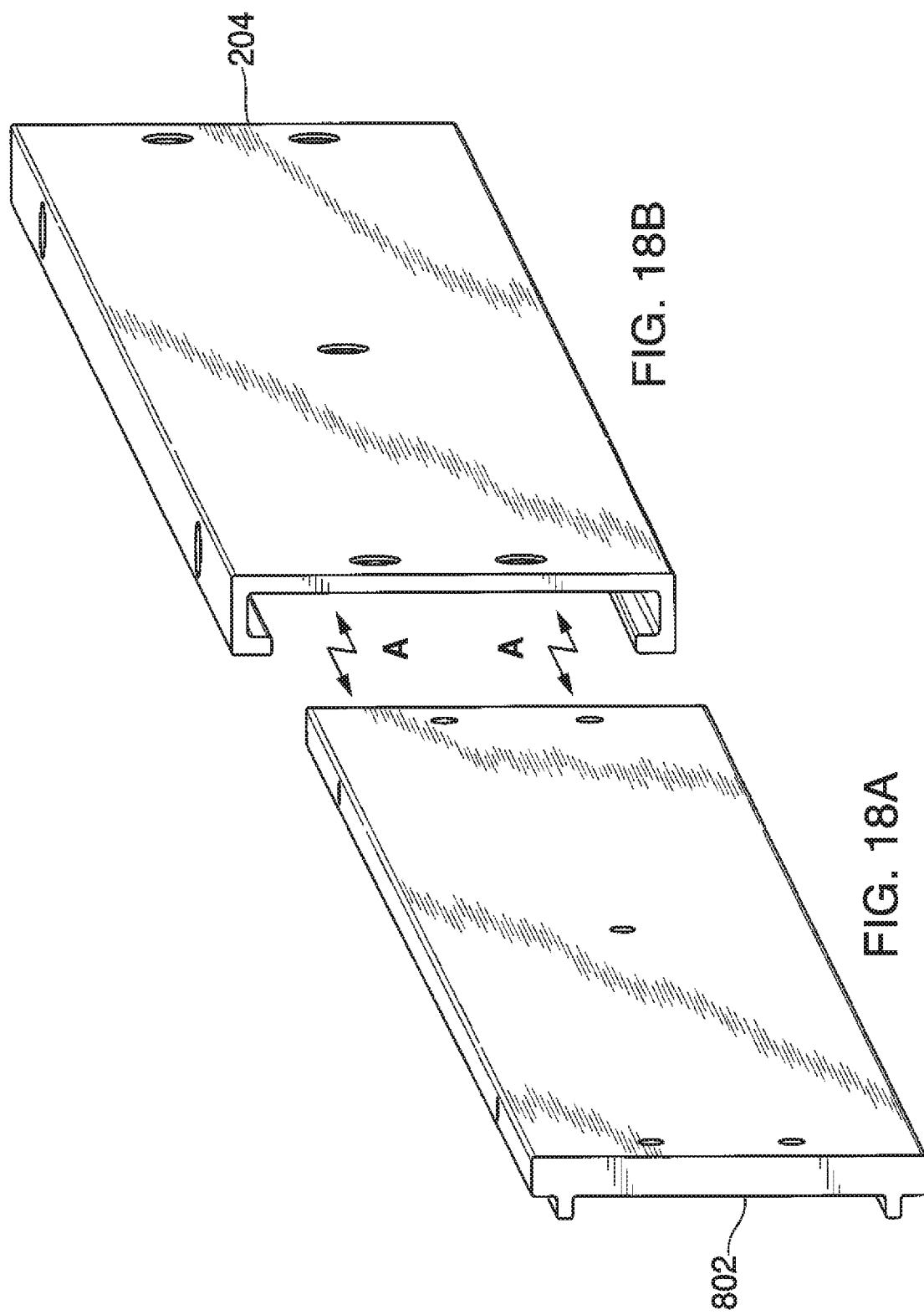

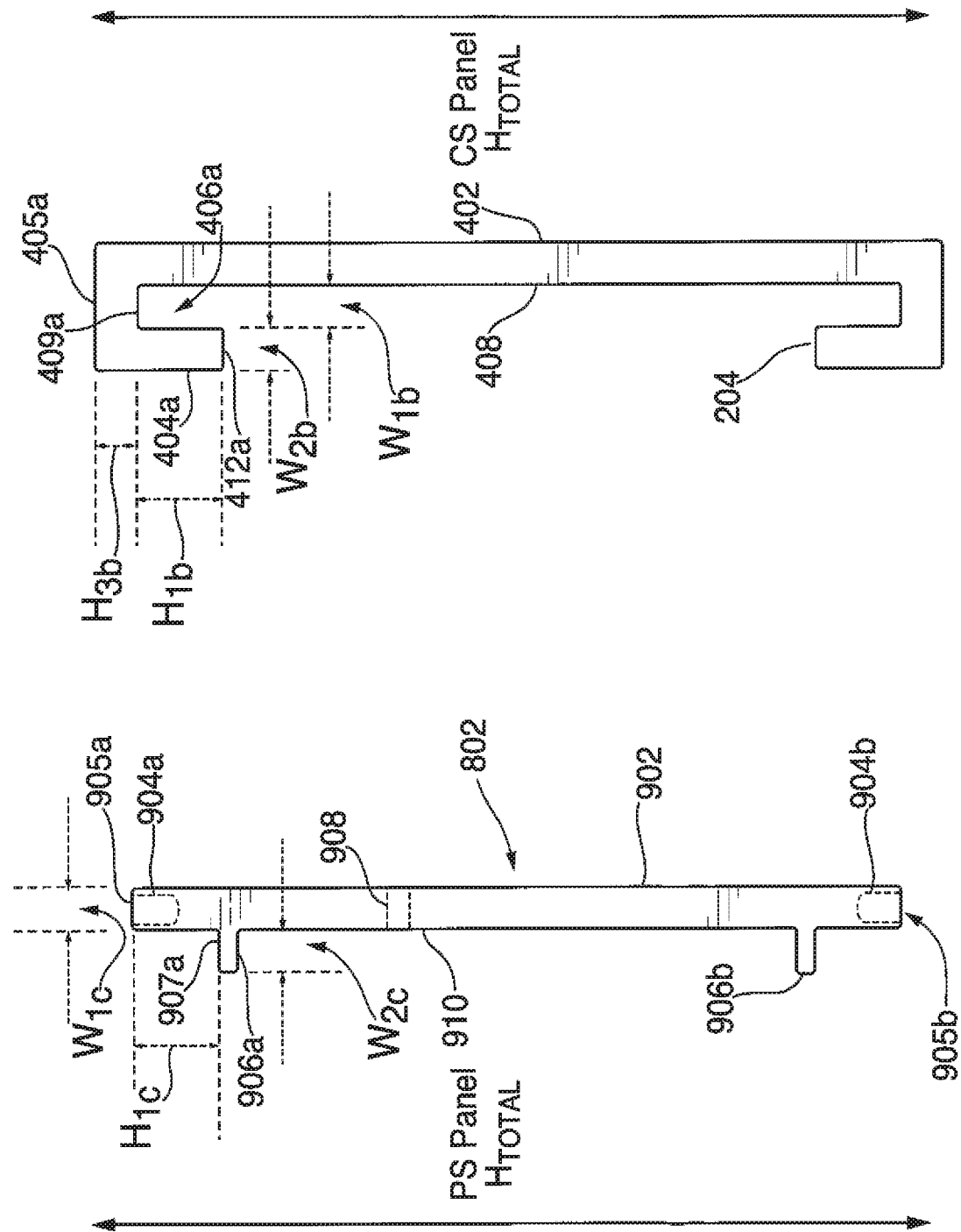

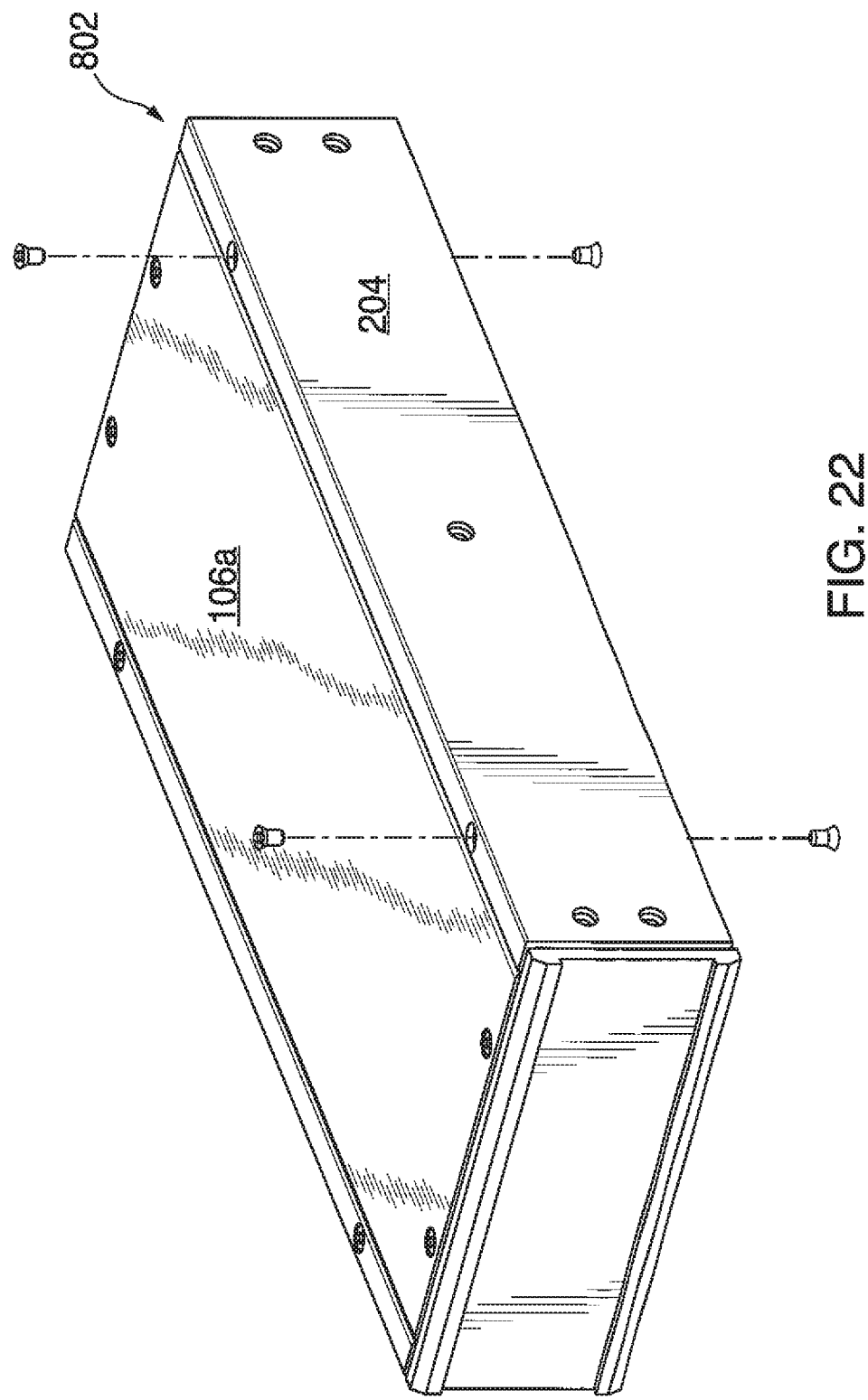

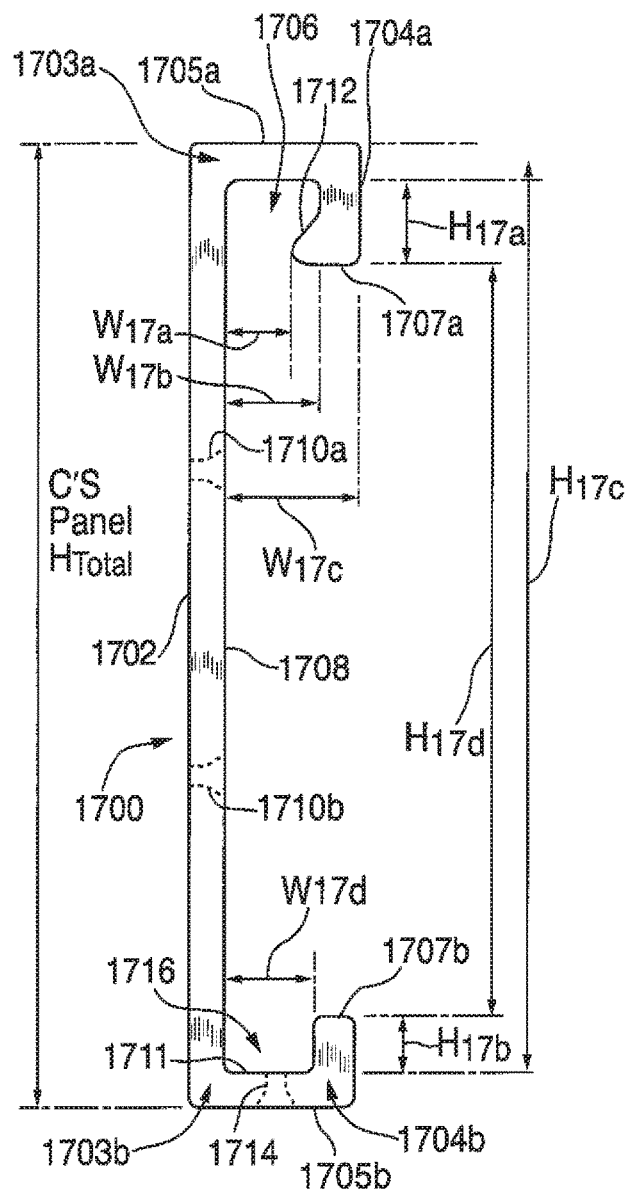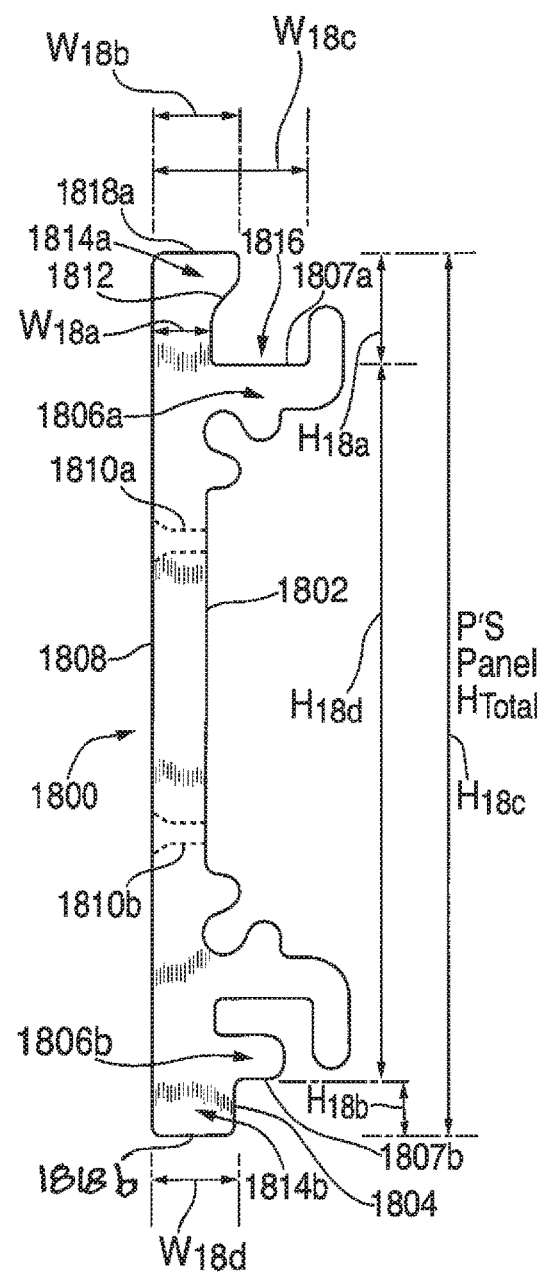

SYSTEM FOR JOINING ELECTRONIC EQUIPMENT HOUSINGS TOGETHER IN A RACK APPARATUS

PRIORITY INFORMATION

The present application claims priority under 35 U.S.C. § 119(e) to U.S. Provisional Patent Application Ser. No. 62/345,093, filed 3 Jun. 2016, and further claims priority under 35 U.S.C. § 121 as a Divisional Application to U.S. Non-provisional patent application Ser. No. 15/605,007, filed May 25, 2017, the entire contents of both of which are expressly incorporated herein by reference.

BACKGROUND OF THE INVENTION

Technical Field

The embodiments described herein relate generally to electronic components and their housings, and more specifically to systems, methods, and modes for joining equipment housings together in a rack system, table top system, wall mount system, or under the table system.

Background Art

FIGS. 1-11 illustrate several known component housing rack mounting systems used for securing rack mounted components to each other and the rack itself. Shown in FIG. 1 is rack mounting system 100, which comprises rack mounting panel 102 affixed to the front of component housing 106, which houses the electronics or other components that performs whatever function the device is designed to perform. Examples of such rack mounting equipment can include communications devices such as switches, or audio equipment such as amplifiers, mixers, digital signal processors, equalizers, among other related equipment. Rack mounted equipment can also include video equipment such as transmitters, receivers, switches, and other types of related components, as well as test equipment, and specially designed equipment. Regardless of the function of the device, those of skill in the art can appreciate that the existing solutions for mounting the equipment housing to the rack and/or each other involves numerous steps, wasted space, and the need to maintain and store numerous screws and/bolts for securing the equipment to each other and the rack. The main modes of securing the rack mounted equipment include the rack mounting holes 104 through which nuts and bolts, and other joining pieces are used to secure the rack mounted equipment to each other and to the rack.

As shown in FIGS. 2 and 3, screws can be used to assemble housing 106 to a U-bracket in the manner shown. Referring to FIG. 4, a different type of bracket assembly is shown to which housing 106 can be attached to. As shown in FIGS. 5-7, a rack mount bracket can be used to secure housing 106 to a rack system. FIGS. 8 and 9 illustrate a different type of rack mount bracket, one in which housing 106 (not shown in FIG. 8) can sit upon and be attached to by one or more screws. FIG. 10 illustrates a different type of rack mount bracket system, one in which there is a plate screwed to two housings 106a,b to assemble them together, and two L-shaped brackets to attach the two housings to a rack system. Referring to FIG. 11, by way of further example, joining plate (plate) 108 joins first and second housings 106a,b together through use of screws/bolts 110a-d. Plate 108 sits in a slightly recessed area.

Accordingly, a need has arisen for improving the systems, methods, and modes for joining equipment housings together in a rack system.

SUMMARY

It is an object of the embodiments to substantially solve at least the problems and/or disadvantages discussed above, and to provide at least one or more of the advantages described below.

It is therefore a general aspect of the embodiments to provide systems, methods, and modes for joining equipment housings together in a rack system, table top system, wall mount system, or under the table system.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Further features and advantages of the aspects of the embodiments, as well as the structure and operation of the various embodiments, are described in detail below with reference to the accompanying drawings. It is noted that the aspects of the embodiments are not limited to the specific embodiments described herein. Such embodiments are presented herein for illustrative purposes only. Additional embodiments will be apparent to persons skilled in the relevant art(s) based on the teachings contained herein.

According to a first aspect of the embodiments, a modular housing apparatus is provided, comprising: a system for joining electronic equipment housings together in a rack system, the system comprising: a first substantially planar, substantially parallelogram H-shaped cubic panel (first panel) comprising a first edge, a second opposing edge (second edge), a first U-shaped channel on the first edge, a second U-shaped channel on the second edge; and a second substantially planar, substantially parallelogram C-shaped cubic panel (second panel) comprising a first U-shaped lip channel adapted to slidingly engage and mate with the first U-shaped channel on the first edge of the first panel, and a second U-shaped lip channel adapted to slidingly engage and mate with the second U-shaped channel on the second edge of the first panel.

According to the first aspect of the embodiments, each of the first and second U-shaped lip channels comprise: a lip portion adapted to slidingly engage and fit into respective first and second U-shaped channels on the first and second edges.

According to the first aspect of the embodiments, each of the first and second U-shaped channels comprise: an outer wall portion that has a first height extending from an uppermost portion of the respective edge to a bottom of the U-shaped channel; and an inner wall portion that has a second height extending from an uppermost portion of the inner wall to the bottom of the U-shaped channel, and wherein a depth of the U-shaped channel is substantially similar to the second height.

According to the first aspect of the embodiments, the second height is less than the first height, and a length of the lip portion is just less than the depth of the U-shaped channel.

According to the first aspect of the embodiments, the first panel is further adapted to be attached to a respective one of the housings.

According to the first aspect of the embodiments, the first panel is further adapted to be made part of a respective one of the housings.

According to the first aspect of the embodiments, the second panel is further adapted to be attached to a respective one of the housings.

According to the first aspect of the embodiments, the second panel is further adapted to be made part of a respective one of the housings.

According to a second aspect of the embodiments, a system for joining electronic equipment housings together in a rack system is provided, the system comprising: a first substantially planar, substantially parallelogram Pi-shaped cubic panel (first panel) comprising a first edge, an opposing second edge (second edge), a first protruding channel stop placed a first distance away from, and substantially parallel to, the first edge, a second protruding channel stop placed a second distance away from, and substantially parallel to, the second edge; and a second substantially planar, substantially parallelogram C-shaped cubic panel (second panel) comprising a first U-shaped lip channel adapted to slidingly engage and mate with the first protruding channel stop and the first edge of the first panel, and a second U-shaped lip channel adapted to slidingly engage and mate with the second protruding channel stop and the second edge of the first panel.

According to the second aspect of the embodiments, each of the first and second U-shaped lip channels comprise: a lip portion adapted to slidingly engage and fit onto respective first and second protruding channel stops.

According to the second aspect of the embodiments, the first panel is further adapted to be attached to a respective one of the housing.

According to the second aspect of the embodiments, the first panel is further adapted to be made part of a respective one of the housing.

According to the second aspect of the embodiments, the second panel is further adapted to be attached a respective one of the housing.

According to the second aspect of the embodiments, the second panel is further adapted to be made part of a respective one of the housing.

According to the second aspect of the embodiments, each of the first and second protruding channel stops comprises a first surface extending from a first side of the first panel having a first width, and each of the lip portions includes an inner surface that interfaces with respective ones of the first and second protruding channel stops, and wherein each of the lip portions comprise a second surface having a second width dimension substantially equal to the first width dimension.

According to the second aspect of the embodiments, the first panel further comprises a first height that extends from an outer surface of respective ones of the first and second protruding channel stops to an outer surface of respective ones of the edges, and the second portion further comprises a depth of the U-shaped channel that is substantially equal to the first height, such that the portion of the first panel that corresponds to the first height fits in a slidingly engagingly manner within the U-shaped channel.

According to a third aspect of the embodiments, a system for joining electronic equipment housings together in a rack system is provided, the system comprising: a substantially planar, substantially parallelogram Pi-shaped cubic panel (first panel) comprising—a mounting side, an interface side opposite and substantially parallel to, the mounting side, a first edge, a first sloped surface located on the mounting side, an second opposing edge (second edge), a first protruding channel stop located a first distance away from, and substantially parallel to, the first edge, the first protruding channel stop protruding substantially perpendicular from the mounting side, a second protruding channel stop located a second distance away from, and substantially parallel to, the second edge, the second protruding channel stop protruding substantially perpendicular from the mounting side, and wherein, the first sloped surface sloped at a first angle, and located between the first edge and the first protruding channel stop, and further wherein, the mounting side including a first planar portion and a second planar portion, the first and second planar portions being substantially parallel to each other, and wherein the first sloped surface originating on the first planar portion and terminating at the second planar portion; and a substantially planar, substantially parallelogram C-shaped cubic panel (second panel) comprising a mounting side, an interface side, a first S-shaped upper channel adapted to slidingly engage and mate with the first protruding channel stop and the first edge of the first panel, the first S-shaped upper channel formed, in part, by an upper lip, the upper lip including a second sloped surface sloped at a second angle, and is located to engage and mate with the first sloped surface of the first panel, the first and second sloped surfaces having substantially similar dimensions, and wherein the first angle and second angle are substantially similar, and a U-shaped lower channel adapted to slidingly engage and mate with the second protruding channel stop and the second edge of the first panel.

According to the third aspect of the embodiments, the first panel is further adapted to be attached to a respective one of the housings.

According to the third aspect of the embodiments, the first panel is further adapted to be made part of a respective one of the housings.

According to the third aspect of the embodiments, the second panel is further adapted to be attached to a respective one of the housings.

According to the third aspect of the embodiments, the second panel is further adapted to be made part of a respective one of the housings.

BRIEF DESCRIPTION OF THE DRAWINGS

The above and other objects and features of the embodiments will become apparent and more readily appreciated from the following description of the embodiments with reference to the following figures. Different aspects of the embodiments are illustrated in reference figures of the drawings. It is intended that the embodiments and figures disclosed herein are to be considered to be illustrative rather than limiting. The components in the drawings are not necessarily drawn to scale, emphasis instead being placed upon clearly illustrating the principles of the aspects of the embodiments. In the drawings, like reference numerals designate corresponding parts throughout the several views.

FIGS. 1-11 illustrate known systems and components of housing rack mounting systems used for securing rack mounted components to each other and the rack itself.

FIG. 12 illustrates components of a rack equipment mounting system according to aspects of the embodiments.

FIG. 13 illustrates a close-up side view of a U-channel sliding panel for use in the rack equipment mounting system as shown in FIG. 12 according to aspects of the embodiments.

FIG. 14 illustrates a close up side view of a C-shaped sliding panel for use in the rack equipment mounting system as shown in FIG. 12 according to aspects of the embodiments.

FIGS. 15A-15D illustrate a side view of the rack equipment mounting system of FIG. 12 as used in a first manner of assembly according to aspects of the embodiments.

FIGS. 16A-16B illustrate a side view of the rack equipment mounting system of FIG. 12 as used in a second manner of assembly according to aspects of the embodiments.

FIGS. 18a and 18B illustrate components of a further embodiment of a rack equipment mounting system according to aspects of the embodiments.

FIG. 19A illustrates a close-up side view of a Pi-shaped sliding panel for use with the C-channel sliding panel shown in FIG. 19B for use in a rack equipment mounting system according to aspects of the embodiments.

FIGS. 22-26 illustrate several perspective views of a further step in the assembly of two housings using the Pi-shaped sliding panel and C-shaped sliding panel according to aspects of the embodiments.

FIG. 27 illustrates a side view of a modified C-shaped sliding panel for use in the rack equipment mounting system as shown in FIG. 12 according to aspects of the embodiments.

FIG. 28 illustrates a side view of a modified Pi-shaped sliding panel for use with the modified C-channel sliding panel (also shown in FIG. 27) for use in a rack equipment mounting system according to aspects of the embodiments.

DETAILED DESCRIPTION

Figure 1:
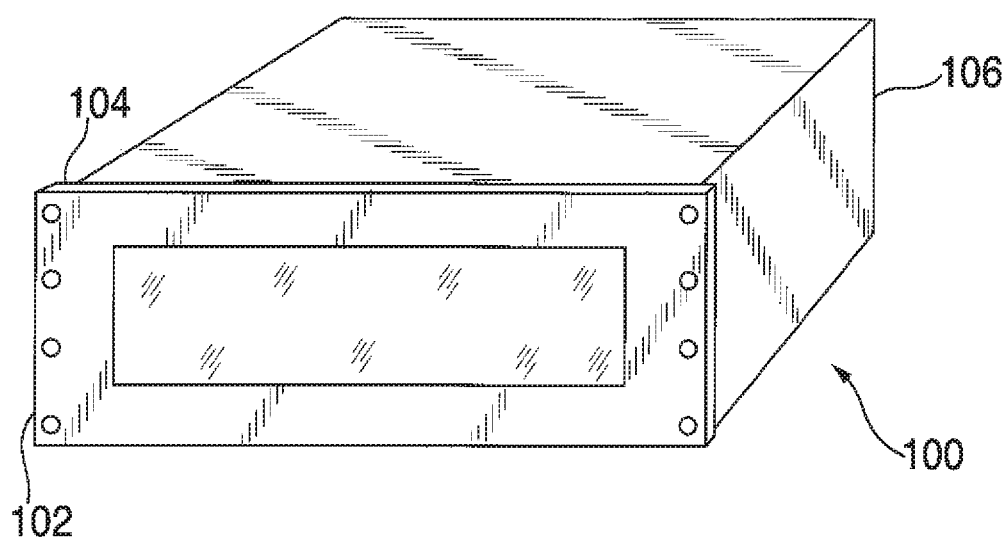
Figure 4:
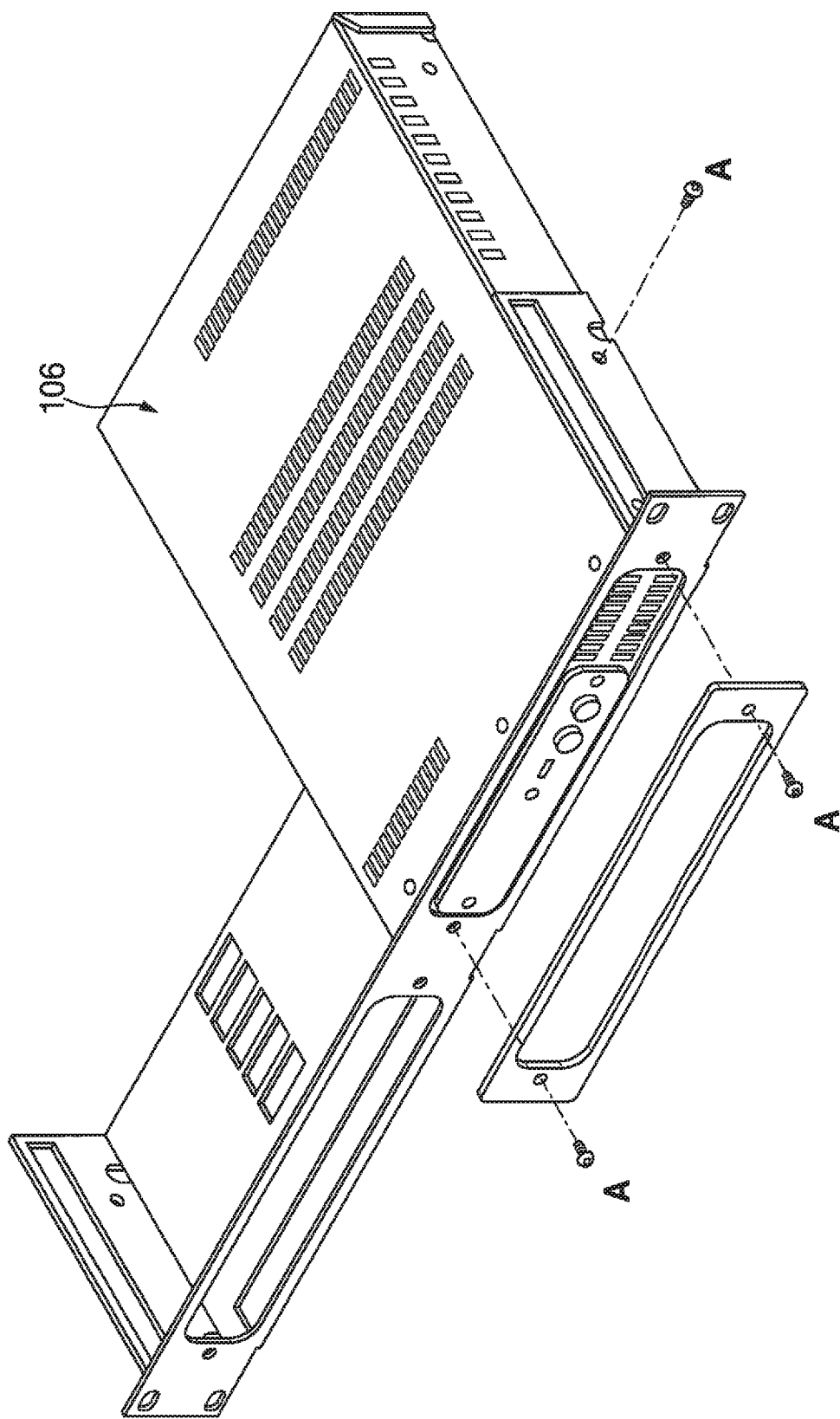
Figure 5:
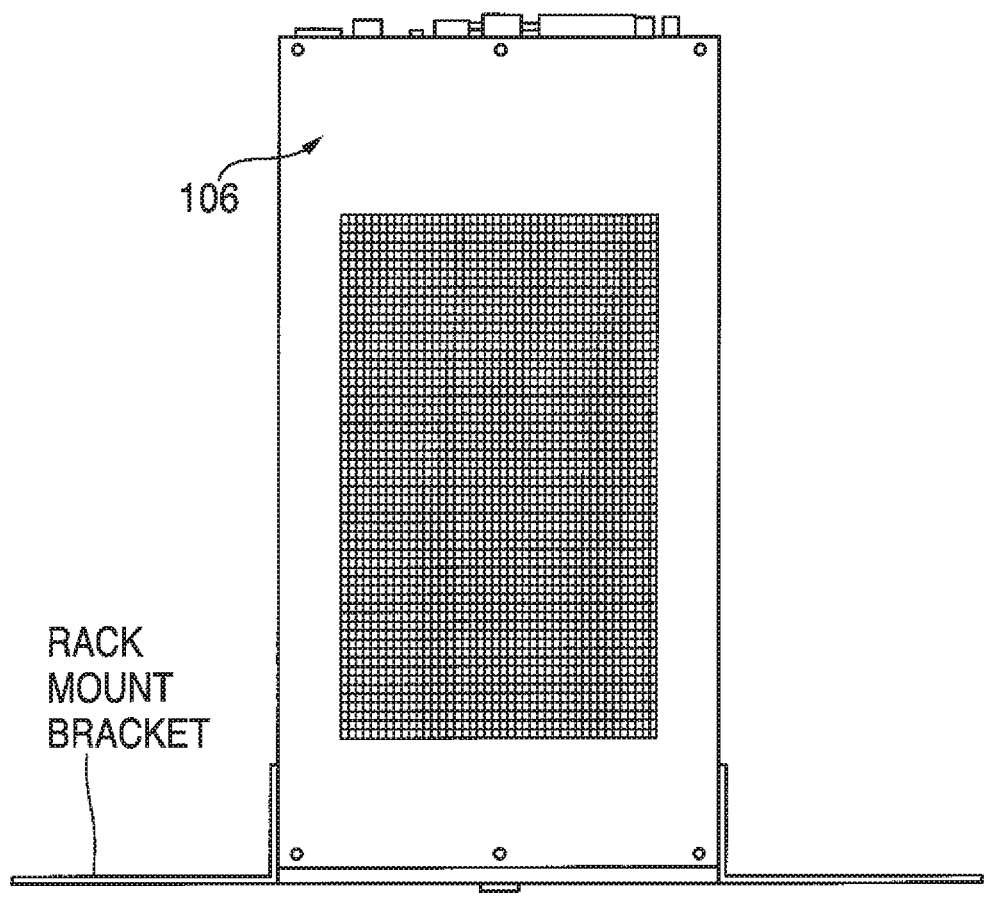
Figure 6:
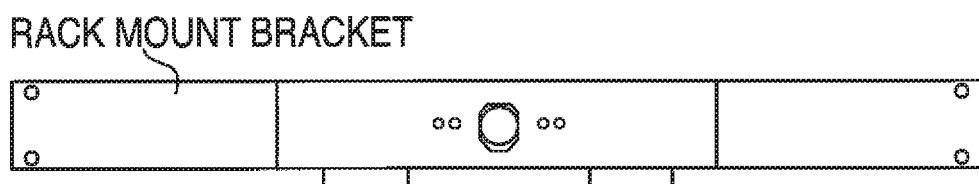
Figure 7:
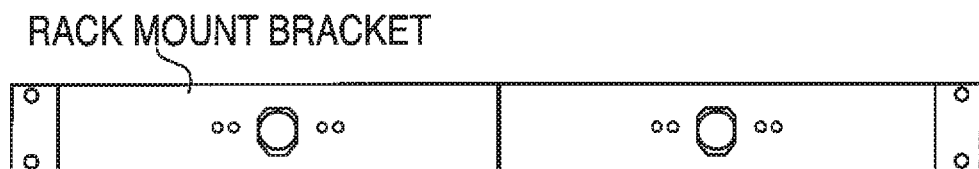
Figure 8:
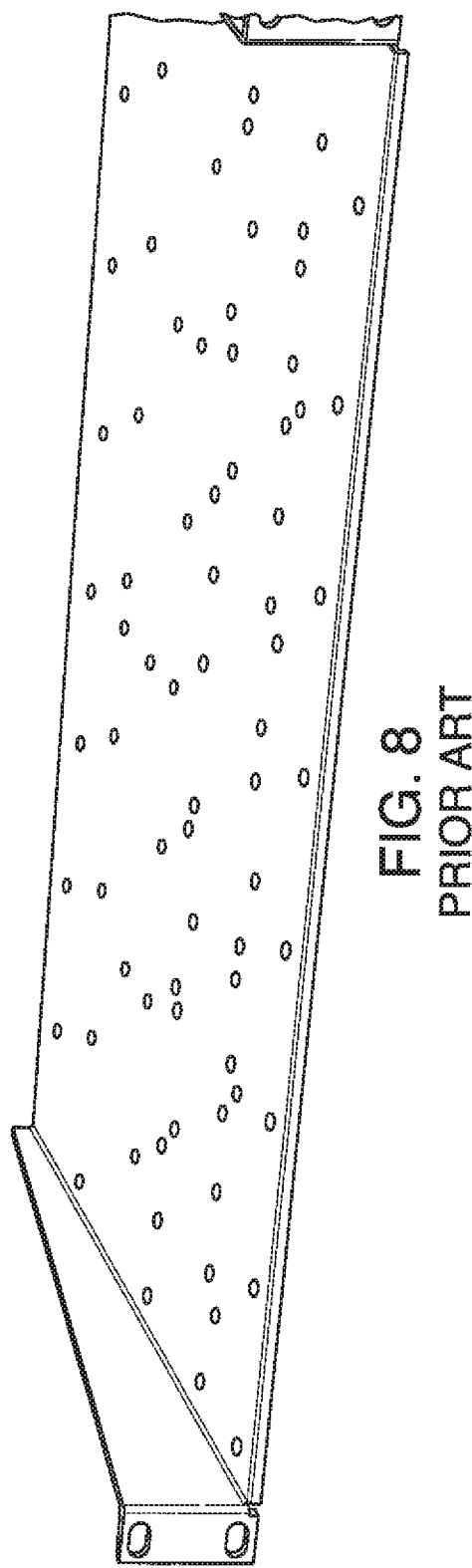
Figure 9:
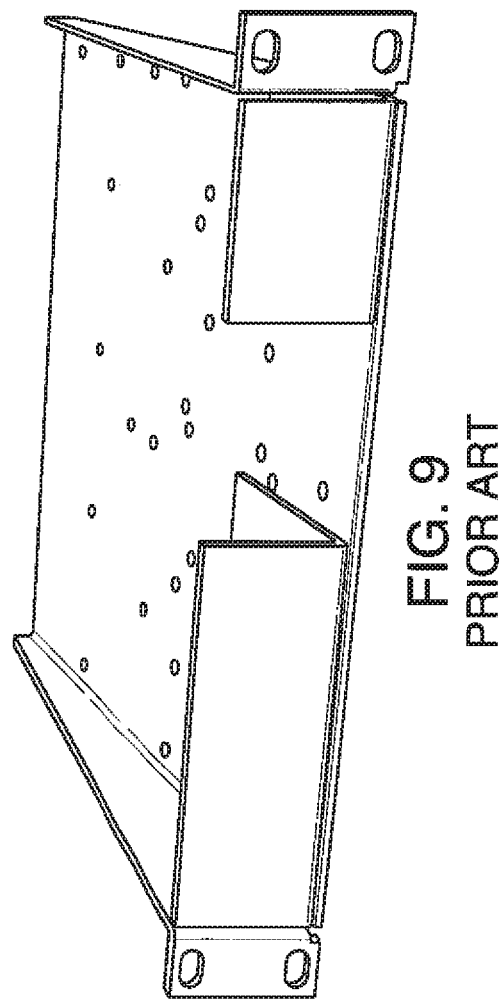
Figure 10:
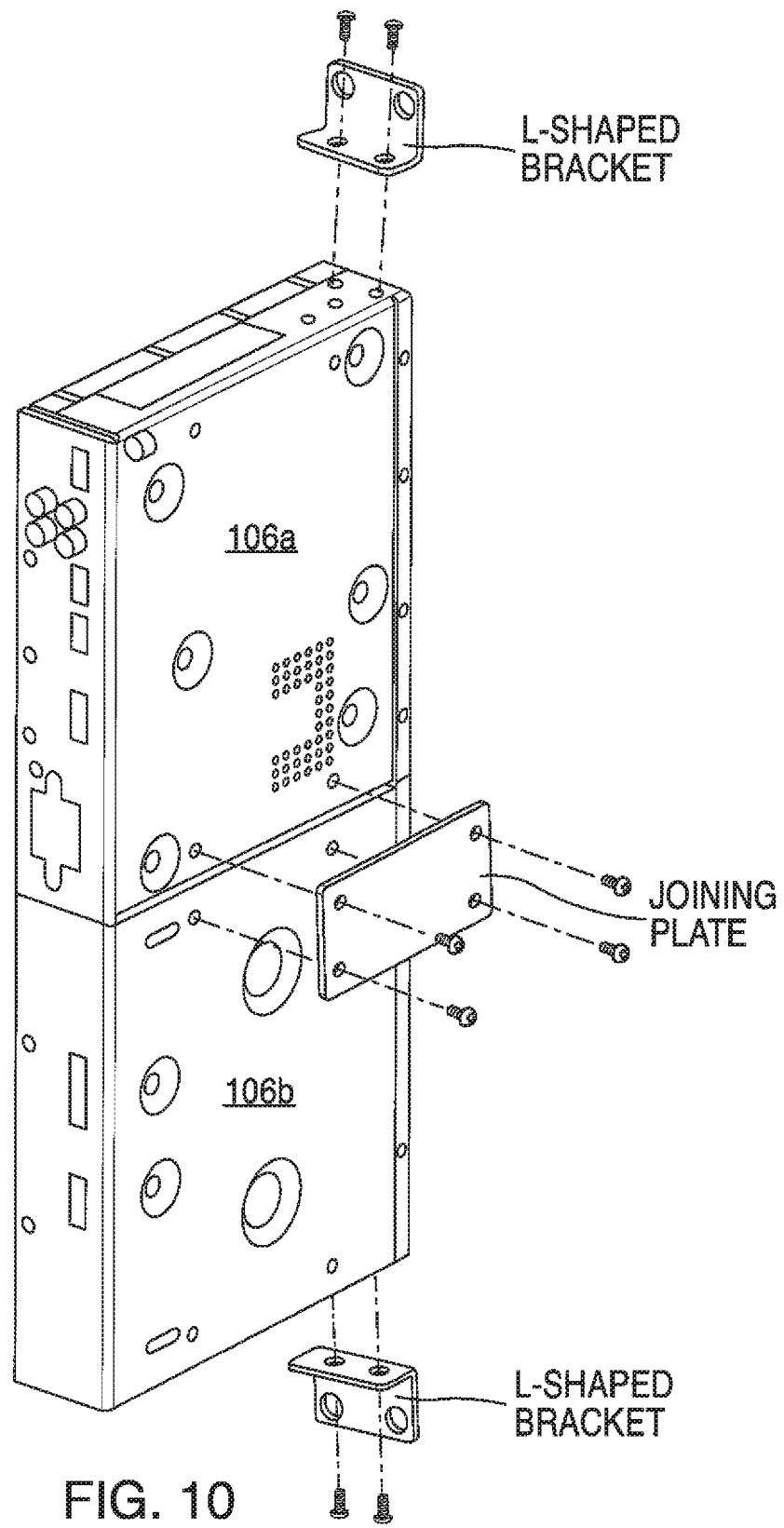
Figure 11:
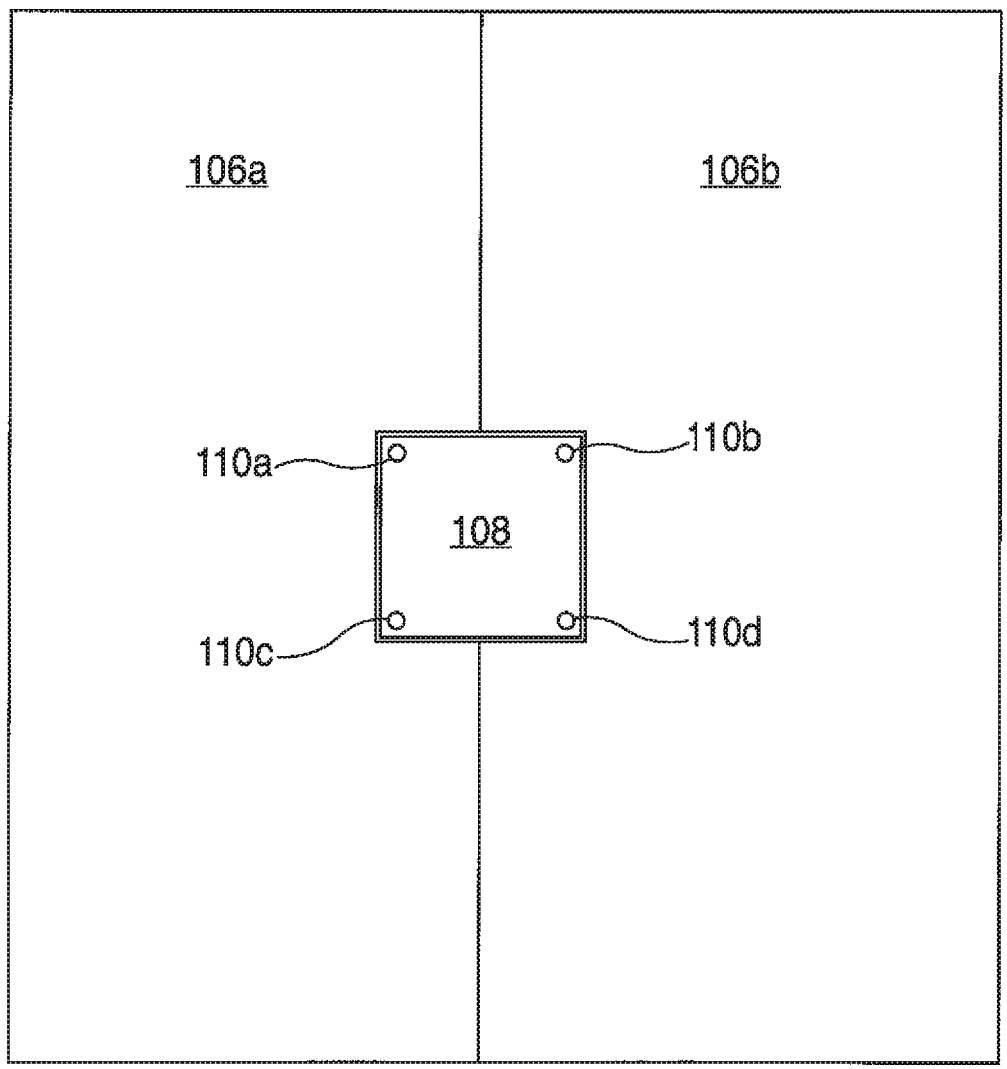

The embodiments are described more fully hereinafter with reference to the accompanying drawings, in which different aspects of the embodiments are shown. In the drawings, the size and relative sizes of layers and regions may be exaggerated for clarity. Like numbers refer to like elements throughout. The embodiments may, however, be embodied in many different forms and should not be construed as limited to the embodiments set forth herein. Rather, these embodiments are provided so that this disclosure will be thorough and complete, and will fully convey the scope of the inventive concept to those skilled in the art. The scope of the embodiments is therefore defined by the appended claims. The detailed description that follows is written from the point of view of a control systems company, so it is to be understood that generally the concepts discussed herein are applicable to various subsystems and not limited to only a particular controlled device or class of devices, such as audio preamplifiers.

Reference throughout the specification to "one embodiment" or "an embodiment" means that a particular feature, structure, or characteristic described in connection with an embodiment is included in at least one embodiment of the embodiments. Thus, the appearance of the phrases "in one embodiment" on "in an embodiment" in various places throughout the specification is not necessarily referring to the same embodiment. Further, the particular feature, structures, or characteristics may be combined in any suitable manner in one or more embodiments.

LIST OF REFERENCE NUMBERS FOR THE ELEMENTS IN THE DRAWINGS IN NUMERICAL ORDER

The following is a list of the major elements in the drawings in numerical order.

100 Existing Component Housing Rack Mounting System
102 Rack Mounting Panel
104 Rack Mounting Holes
106 Component Housing
108 Joining Plate (Plate)
200 Rack Equipment Mounting System
202 H-Shaped Sliding Panel (HS Panel)
204 C-Shaped Sliding Panel (CS Panel)
302 HS Panel Mounting Side
304 HS Panel U-Shaped Channel (U-Shaped Channel)
305 HS Panel Edge
306 U-Shaped Channel Outer Lip
307 U-Shaped Channel Inner Lip
308 HS Panel Interface Side
309 U-Shaped Channel Lower Surface
310 Mounting Screw/Bolt (Mounting) Holes
402 CS Panel Mounting Side
404 Lip
405 CS Panel Edge
406 U-Shaped Channel
408 CS Panel Interface Side
409 U-Shaped Channel Lower Surface
410 Mounting Screw/Bolt Holes
412 Inner Surface of Lip
700 Rack
702 Rack Tray
802 Pi-Shaped Sliding Panel (PS Panel)
902 Sliding Panel Interface Side
904 U-Channel Insert
905 PS Panel Edge
906 Channel Stop
907 Outer Surface of Channel Stop
908 Mounting Screw Hole(s)
910 Mounting Side
1700 Modified C-Shaped Sliding (C'S) Panel
1702 C'S Panel Mounting Side (Mounting Side)
1703a C'S Panel Upper Edge 1703b C'S Panel Lower Edge
1704a Upper Lip
1704b Lower Lip
1705a Upper Edge Outer Surface
1705b Lower Edge Outer Surface
1706 S-shaped Upper Channel
1707a Upper Lip Inner Surface
1707b Lower Lip Inner Surface
1708 C'S Panel Interface Side (Interface Side)
1709 Upper Edge Inner Surface
1710 Mounting Holes
1711 Lower Edge Inner Surface
1712 Sloped Surface
1714 Set-screw Hole
1716 Lower Channel
1800 Modified Pi-shaped Sliding (P'S) Panel
1802 Modified Pi Shaped Sliding Panel Mounting Side (Mounting Side)
1804 Lower Panel Edge Vertical Surface
1806a Upper Channel Stop
1806b Lower Channel Stop
1807a Upper Channel Stop Outer Surface
1807b Lower Channel Stop Outer Surface
1808 Modified Pi Shaped Sliding Panel Interface Side (Interface Side)
1810 Mounting Screw Hole(s)
1812 Sloped Surface
1814a P'S Panel Upper Edge
1814b P'S Panel Lower Edge
1816 S-Shaped Channel (S-Channel)
1818a Upper Edge Outer Surface
1818b Lower Edge Outer Surface

LIST OF ACRONYMS USED IN SPECIFICATION IN ALPHABETICAL ORDER

The following is a list of acronyms in alphabetical order.
CS "C" Shaped
C'S Modified CS
HS "H" Shaped
PS Pi Shaped
P'S Modified PS Different aspects of the embodiments as described herein can be considered in the context of audio components, and more specifically to systems, methods, and modes for systems, methods, and modes for joining equipment housings together in a rack system, but is not limited thereto, except as may be set forth expressly in the appended claims.

Aspects of the embodiments provide a system for mounting electronics equipment (housing) side-by-side. Once the electronic housings are joined together, they can be either rack mounted, used in a table top system, or installed as wall mount equipment. Frequently, customers are required to complete joining of the equipment side-by-side as they decide to grow their functionality over time. Therefore, there is a desire to make assembly as simple as possible with minimum additional hardware for the customers.

For 40 years Creston Electronics Inc., has been the world's leading manufacturer of advanced control and automation systems, innovating technology to simplify and enhance modern lifestyles and businesses. Crestron designs, manufactures, and offers for sale integrated solutions to control audio, video, computer, and environmental systems. In addition, the devices and systems offered by Crestron streamlines technology, improving the quality of life in commercial buildings, universities, hotels, hospitals, and homes, among other locations. Accordingly, the systems, methods, and modes of the aspects of the embodiments described herein, as embodied in the AMP Modular Product Series, can be manufactured by Crestron Electronics Inc., located in Rockleigh, NJ FIG. 12 illustrates components of rack equipment mounting system (mounting system) 200 according to aspects of the embodiments, FIG. 13 illustrates a close up side view of H-Shaped sliding panel (HS panel) 202 for use in rack equipment mounting system 200 as shown in FIG. 12, and FIG. 14 illustrates a close up side view of C-shaped sliding panel (CS panel) 204 for use in rack equipment mounting system 200 as shown in FIG. 12, according to aspects of the embodiments.

Referring to FIGS. 13 and 14, CS panel 202 comprises, in this embodiment, a pair of U-shaped channels 304a,b located at a top and bottom of HS panel 202 (as those of skill in the art can appreciate, the use of the terminology "top" and "bottom" are relative terms, and are not intended to, and should not be understood, as limiting terminology; they are simply used as location reference terms to make understanding the Figures and aspects of the embodiments easier to understand). HS panel 202 is substantially planar, as shown in FIGS. 12, 13, and 14, among other Figures, and is generally fabricated to be the same length as a side of the equipment housing to which it can be attached to, or alternatively, it can be the side of the equipment housing and be a component of the original parts list used to fabricate the equipment housing, according to aspects of the embodiments.

HS panel 202 comprises mounting side 302, U-shaped channels 304a,b, edges 305a,b, U-shaped channel outer lips (outer lips) 306a,b, U-shaped channel inner lips (inner lips) 307a,b, HS panel interface side 308, U-shaped channel lower surface (U-channel lower surface) 309, and a plurality of mounting holes 310 according to aspects of the embodiments. As discussed above, receptacle sliding panel 202 can be added to an existing equipment housing 106, or it can replace a side panel of the equipment housing 106 such that it is a component part listed in the list of build components or parts when fabricating equipment housing 106. For the purposes of this discussion, it shall be presumed that both receptacle sliding panel 202 and protrusion sliding panel 204 are additional components, in the manner shown in FIGS. 12, 13, and 14. Protrusion sliding panel 204 comprises mounting side 402, lips 404a,b, U-channels 406a,b, sliding panel interface side 408, and a plurality of mounting holes 410. Also shown in FIG. 13 are a plurality of dimensions, $H_{1a}$, $H_{2a}$, $H_{3a}$, $W_{1a}$, and $W_{2a}$; each will be discussed in greater detail below.

According to aspects of the embodiments, both of receptacle sliding panel 202 and protrusion sliding panel 204 can be mounted on respective equipment housings 106a,b, respectively, such that the two can be mounted together on a tray in a rack mounting system. As such, an installer would secure panels 202, 204 to respective separate equipment housing using one or more of the plurality of holes 310, 410 to secure panels 202, 204 to their respective housing 106a,b.

Referring now to FIG. 14, there is shown an end view of CS panel 204 according to aspects of the embodiments. CS panel 204 comprises CS panel mounting side (mounting side) 402, lips 404a,b, CS panel edges (edges) 405a,b, U-shaped channels 406a,b, CS panel interface side 408, U-shaped channel lower surface (U-channel lower surface) 409, and a plurality of mounting holes 410 according to aspects of the embodiments. Also shown in FIG. 14 are a plurality of dimensions, $H_{1b}$, $H_{3b}$, $W_{1b}$, and $W_{2b}$; each will be discussed in greater detail below.

Once panels 202, 204 have been mounted to their respective housings 106a,b, a first housing 106a can be slid and joined to the second housing 106b in the manner indicated by arrows A and B of FIG. 12. That is, referring to FIGS. 12, 13, and 14, lips 404a,b of panel 204 can fit into U-shaped channels 304a,b, respectively, of panel 202, and outer lips 306a,b of panel 202 fit into U-shaped channels 406a,b of panel 204 according to aspects of the embodiments. In this manner, the two housings 106a,b can be securely mounted to each other.

To facilitate such mating of HS panel 202 with CS panel 204, the several dimensions of the respective panels 202, 204, are made substantially similar to one another. For example, height $H_{1a}$, the height of inner lip 307a, defined as extending from its upper surface (part of edge 305a) to lower surface 309a (and which is substantially similar to the depth of U-shaped channel 304a), is also substantially similar to the height $H_{1b}$ of lip 404a of CS panel 204 (which is also substantially similar to the depth of U-shaped channel 406a of CS panel 204). Thus, lip 404a is substantially similar in dimension to that of U-shaped channel 304a so that lip 404a fits in a slidingly engaging manner with U-shaped channel 304a. In further support of such slidingly engagement, a width $W_{1b}$ of U-shaped channel 406a of CS panel 204 is substantially similar to that of width $W_{1a}$ of inner lip 307a of HS panel 202. In this manner, lip 307a fits in a slidingly engaging manner with U-shaped channel 406a of CS panel 204 according to aspects of the embodiments. According to still further aspects of the embodiments, heights $H_{3a}$, and $H_{3b}$ are substantially similar, so that heights CS panel $H_{Total}$ and HS Panel $H_{Total}$ are also substantially similar; in addition, height $H_{2a}$ of HS panel 202 is substantially equal to that of the sum of heights $H_{1b}$ and $H_{3b}$ of CS panel 204 according to still further aspects of the embodiments.

Figure 17:
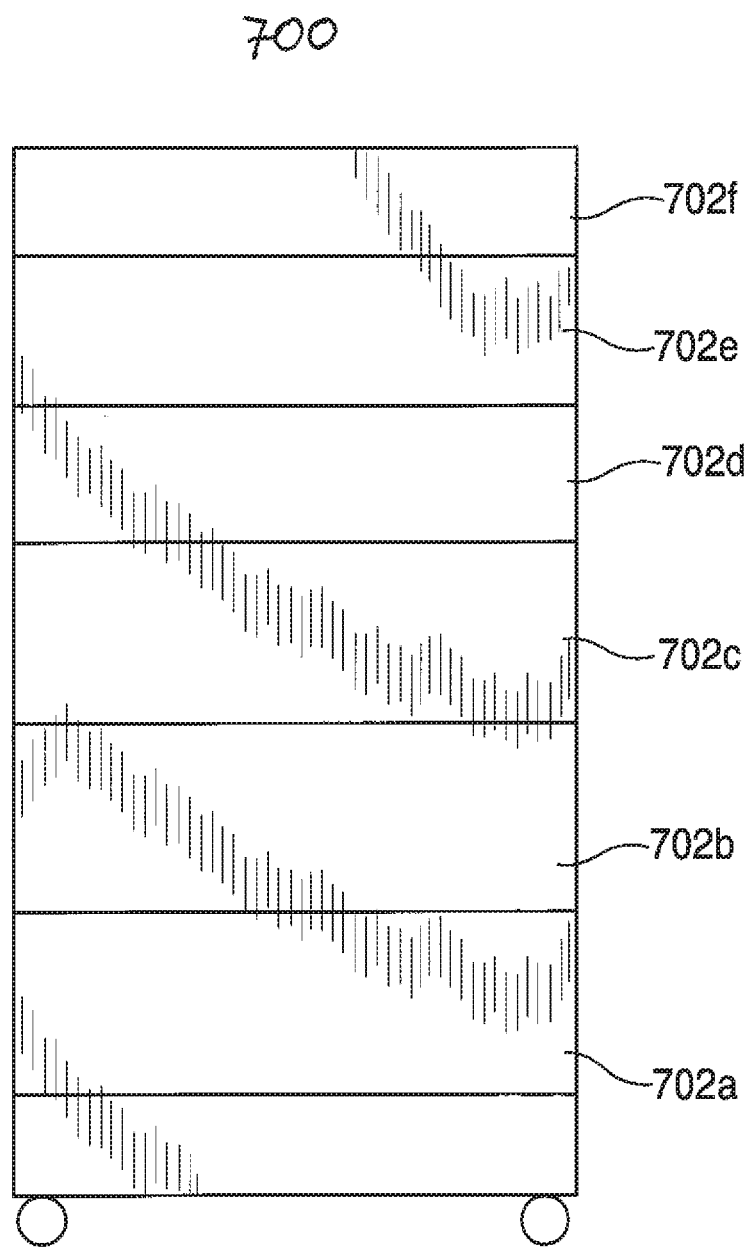
FIG. 17 illustrates a plurality of trays of a rack for mounting one or more equipment housings 106 using rack equipment mounting system according to aspects of the embodiments.

According to further aspects of the embodiments, panels 202, 204 can also be used to mount housings 106 to the sides of a rack mounting system, and can further comprise the sides as well, such that a series of housings 106 can be mounted to each other and to each side of a particular tray of a rack. As those of skill in the art can appreciate, housings 106 are typically of the same height, but have different widths, in order to fit within a vertical space of a tray of a rack. Even if the housings are of different heights, rack mounting system 200 can still be used to mount the housings 106 together and to the sides of the tray of the rack. FIG. 17 illustrates a plurality of trays 702 of a rack 700.

FIG. 15 illustrates a side view of rack equipment mounting system 200 of FIG. 12 as used in a first manner of assembly according to aspects of the embodiments. In FIG. 15, receptacle panel 202 is attached to first equipment housing 106a using one or more screws/bolts and holes 310 according to aspects of the embodiments. Protrusion panel 204 is attached to second equipment housing 106b using one or more screws/bolts and holes 410 according to aspects of the embodiments. After attachment of panel 202 to housing 106a, and attachment of panel 204 to housing 106b, panel 202 housing 106a can be slid into panel 204 of housing 106, or, alternatively, panel 204 of housing 106b can be slid over panel 202 of housing 106a according to aspects of the embodiments.

FIG. 16 illustrates a side view of the rack equipment mounting system of FIG. 12 as used in a second manner of assembly according to aspects of the embodiments. In FIGS. 12-15, panels 202, 204 were separate items attached to housings 106; in FIG. 16, panels 202, 204 are made part of housings 106a,b; aside from this different, panels 202, 204 operate substantially similarly in the arrangement of FIG. 16 as they do in FIGS. 12-15 according to aspects of the embodiments.

FIG. 18 illustrates components of a further embodiment of a rack equipment mounting system according to aspects of the embodiments. In place of HS panel 202 for use with CS panel 204, Pi-shaped sliding (PS) panel 802 can be substituted. In operation, the combination of PS panel 802 with CS panel 204 is substantially similar to that of HS panel 202 with CS panel 204. That is, PS panel 802 can slide onto CS panel 204 (or visa-versa) along arrows A as shown in FIG. 18. According to aspects of the embodiments, PS panel 802 is shaped like the Greek letter "π" in that there is a substantially flat portion and two substantially perpendicular portions on a same side and extending away from the substantially flat portion.

FIG. 19A illustrates a close-up side view of PS panel 802 for use with CS panel 204 shown in FIG. 19B for use in rack equipment mounting system 200 according to aspects of the embodiments. PS panel 802 comprises sliding panel interface side 902, which is a substantially flat planar portion that interfaces with interface side 408 of CS panel 204. Further, PS panel 802 comprises U-channel insert 904a,b, PS panel edges (edges) 905a,b, channel stops 906a,b, and mounting side 910. U-channel inserts 904a,b are inserted into, or are enveloped by, U-shaped channels 406a,b, respectively. Channel stops 906a,b interface with lips 404a,b to provide a smooth sliding interface. According to aspects of the embodiments, channel stops 906a,b can extend along substantially the entire length of PS panel 802, though that need not necessarily be the case. Mounting holes 908 provide a means to mount PS panel 802 to housing 106, as FIG. 20 illustrates.

To facilitate such mating of PS panel 802 with CS panel 204, the several dimensions of the respective panels 802, 204, are made substantially similar to one another. For example, height $H_{1c}$, the height from outer surface 907a of channel stop 906a to an outermost surface of edge 905, is substantially similar to height $H_{1b}$ that is the height (or depth) of U-shaped channel 406. In addition, the width of the portions of PS panel 802 that are adapted to slide within respective U-shaped channels 406a,b, $W_{1c}$, is substantially similar to that of the width $W_{1b}$, which is the width of U-shaped channels 406a,b. Thus, respective edges 905a,b slidingly engage with and in U-shaped channels 406a,b. Additionally, outer surfaces 907a,b of respective channel stops 906a,b, have a width $W_{2c}$ that is substantially equal to that of width $W_{2b}$ of lip 404 of CS panel 204, such that that PS panel edge 905 fits in a slidingly engaging manner with U-shaped channel 406a. According to still further aspects of the embodiments, heights CS panel $H_{Total}$ and PS Panel $H_{Total}$ are also substantially similar.

Figure 20A:
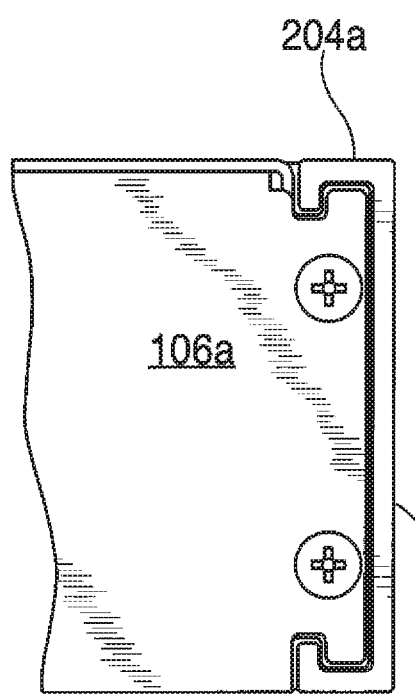
FIGS. 20A-20C illustrate a plurality of side views of a step in the assembly of two housings using the Pi-shaped sliding panel and C-shaped sliding panel according to aspects of the embodiments.
Figure 20B:
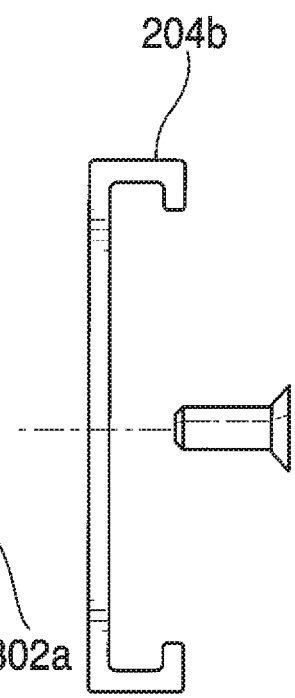
Figure 20C:
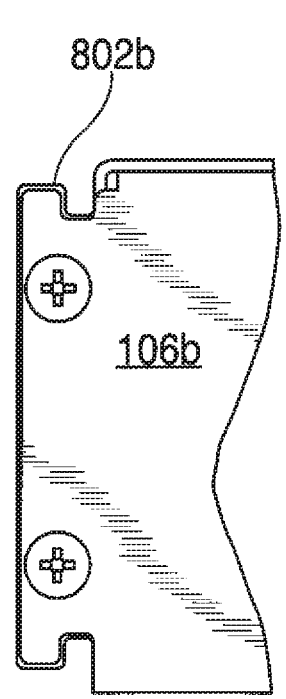
Figures 21A, 21B:
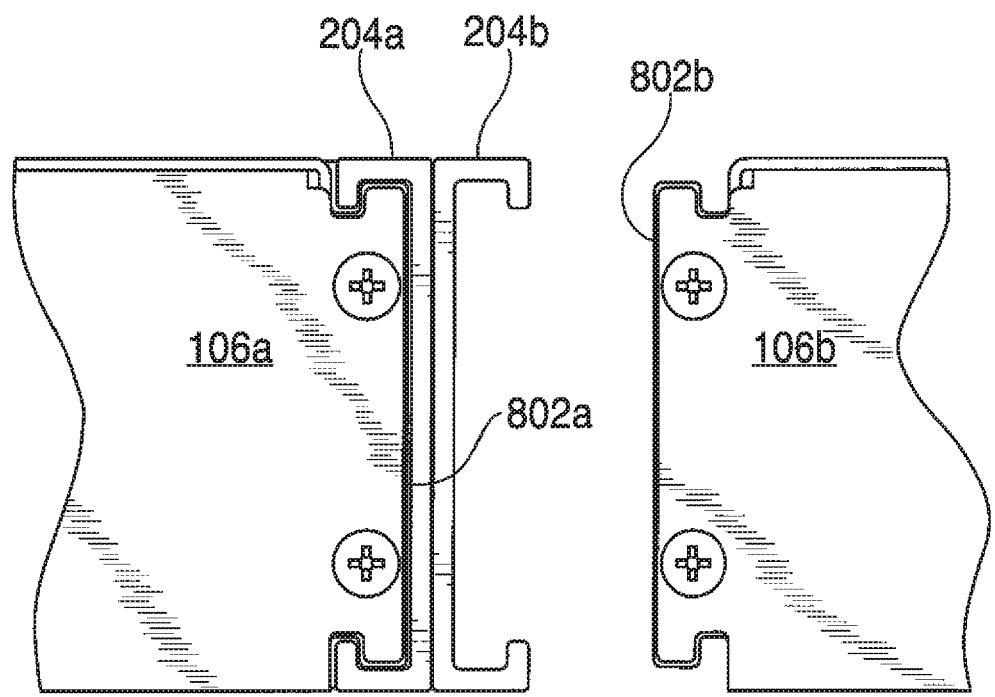
FIGS. 21A and 21B illustrate a plurality of side views of a further step in the assembly of two housings using the Pi-shaped sliding panel and C-shaped sliding panel according to aspects of the embodiments.

FIGS. 20 and 21 illustrate a side view of a first method in the assembly of two housings using PS panel 802 and CS panel 204 according to aspects of the embodiments. In FIG. 20, first PS panel 802a has either already been attached to first housing 106a, or is a component part of the assembly of first housing 106a. First CS panel 204a has also already been attached to first housing 106a, sliding about first PS panel 802a, and screwed into place. Then as shown in FIGS. 20 and 21, second CS panel 204b is being mounted directly to first CS panel 204a back-to-back. Second PS panel 802b and second housing 106b, which are already assembled together, can then slide into CS panel 204b such that the two form an assembly.

Figure 23:
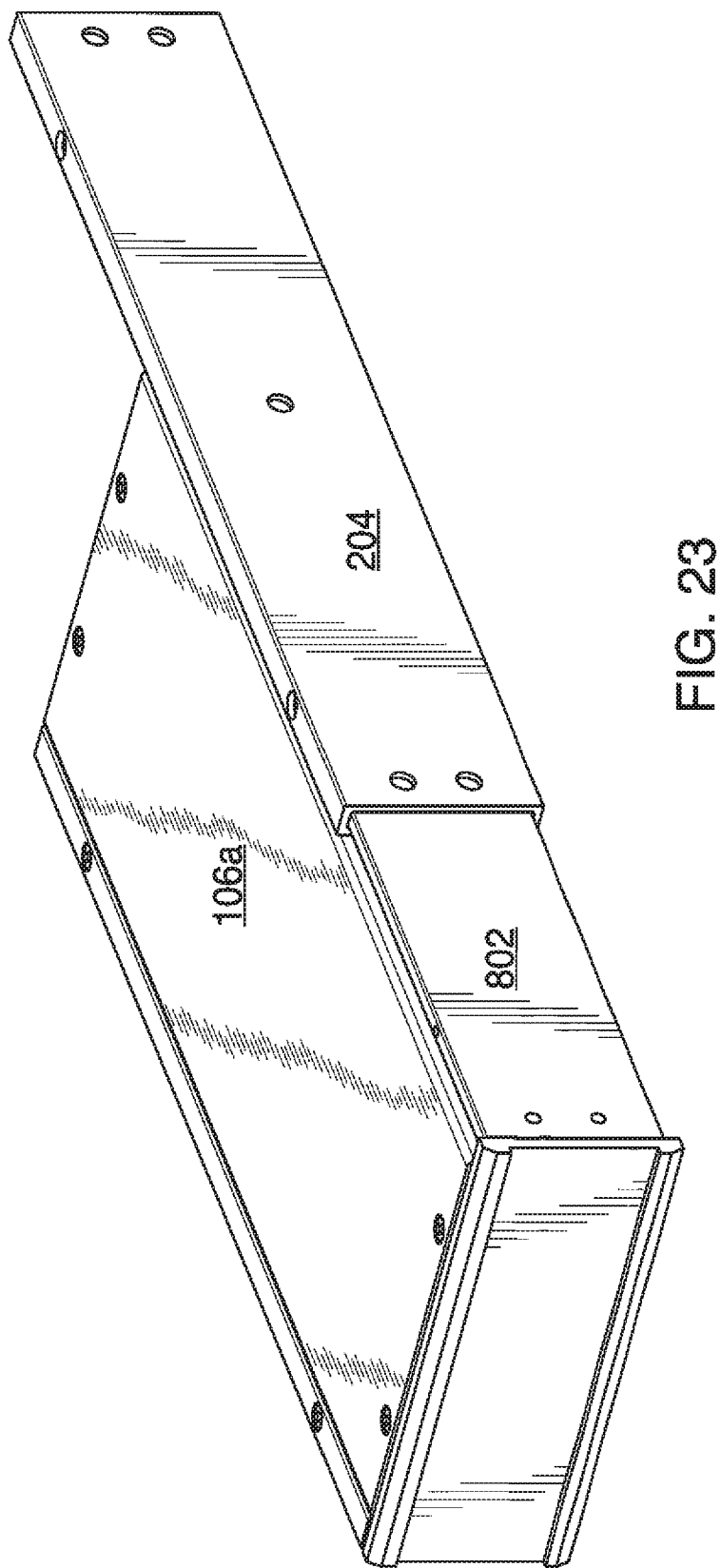
Figure 24:
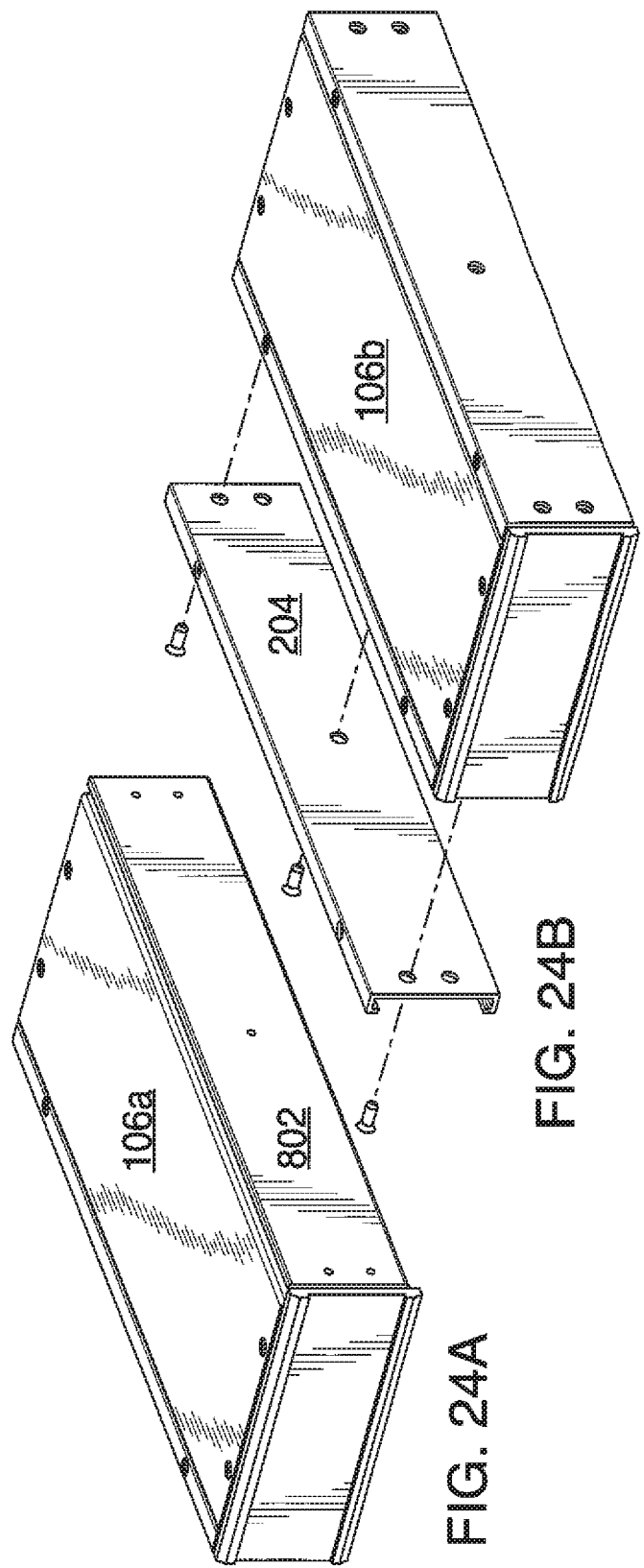
Figure 25:
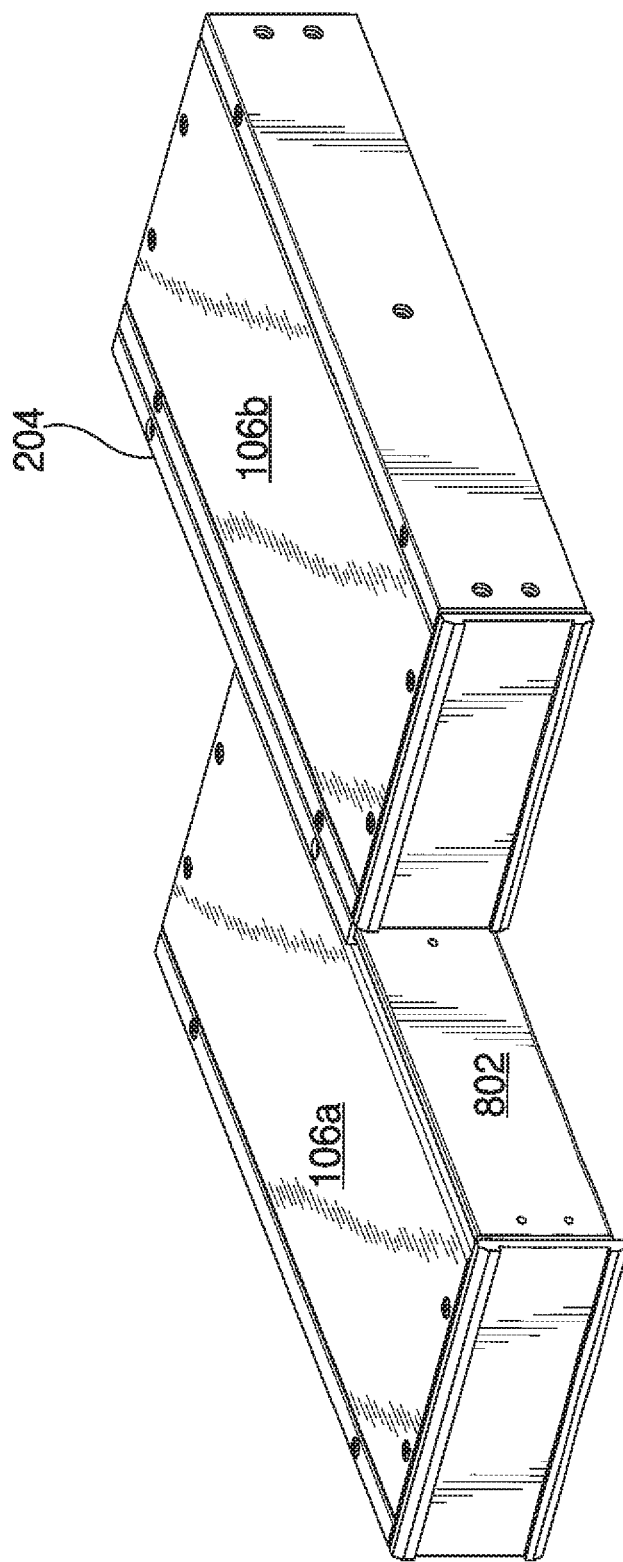
Figure 26:
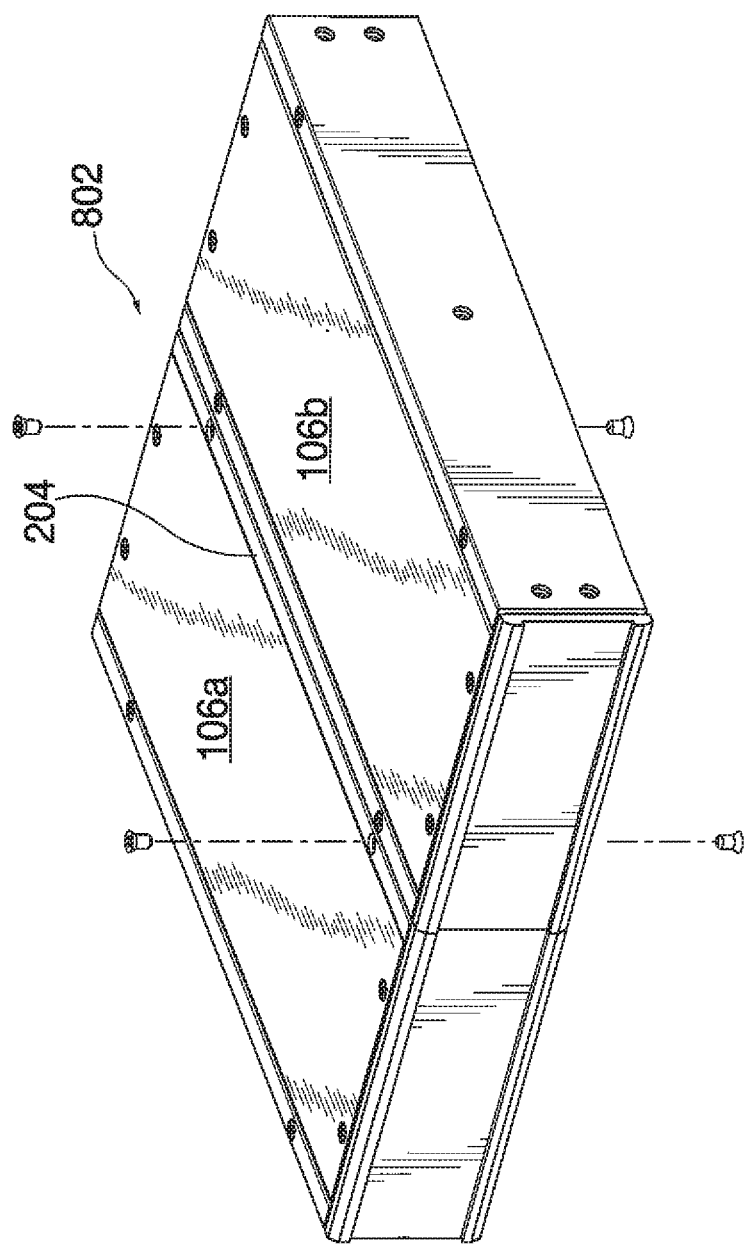

FIGS. 22-26 illustrate several perspective views of a second method of forming an assembly between first and second housings 106a,b using PS panel 802 and CS panel 204 according to aspects of the embodiments. The manner of assembly as shown in FIGS. 22-26 differs from that of the manner of assembly as shown in FIGS. 20 and 21 in that in the former, first CS panel 204 is taken off of first housing 106a and attached to second housing 106b, and then the two housings 106a,b are assembled together. That is, as shown in FIG. 22, housing 106a comprises CS panel 204 that is mounted onto PS panel 802. In FIG. 23, CS panel 204 is being removed from first housing 106a, and in FIG. 24, CS panel 204 is being attached to second housing 106b. Then, in FIG. 25, second housing 106b, with CS panel 204 attached to it, is being slid onto PS panel 802 that is part of first housing 106a according to aspects of the embodiments. FIG. 26 shows the two housings 106a,b assembled together.

FIG. 27 illustrates a side view of modified C-shaped sliding (C'S) panel 1700 for use in rack equipment mounting system 200 as shown in FIG. 12 according to aspects of the embodiments.

Referring now to FIG. 27, there is shown an end view of C'S panel 1700 according to aspects of the embodiments. C'S panel 1700 comprises C'S panel mounting side (mounting side) 1702, C'S panel upper edge 1703a, C'S panel lower edge 1703b, upper lip 1704a, lower lip 1704b, upper edge outer surface 1705a, lower edge outer surface 1705b, S-shaped upper channel 1706, upper lip inner surface 1707a, lower lip inner surface 1707b, C'S panel interface side (interface side) 1708, upper edge inner surface 1709, mounting holes 1710, lower edge inner surface 1711, sloped surface 1712, set-screw hole 1714, and lower channel 1716, according to aspects of the embodiments. Also shown in FIG. 27 are a plurality of dimensions, $H_{17a}$, $H_{17b}$, $H_{17c}$, $W_{17a}$, $W_{17b}$, $W_{17c}$, and $W_{17d}$; each will be discussed in greater detail below.

FIG. 28 illustrates a side view of a modified Pi-shaped sliding (P'S) panel 1800 for use with C'S panel 1700 (as shown in FIG. 27) for use in rack equipment mounting system 200 according to aspects of the embodiments.

Referring now to FIG. 28, there is shown an end view of P'S panel 1800 according to aspects of the embodiments. P'S panel 1800 comprises P'S panel mounting side (mounting side) 1802, lower panel edge vertical surface 1804, upper channel stop 1806a, lower channel stop 1806b, upper channel stop outer surface 1807a, lower channel stop outer surface 1807b, modified Pi-shaped sliding panel mounting side (mounting side) 1808, mounting holes 1810, sloped surface 1812, P'S panel upper edge 1814a, P'S panel lower edge 1814b, and S-shaped channel 1816, according to aspects of the embodiments. Also shown in FIG. 28 are a plurality of dimensions, $H_{18a}$, $H_{18b}$, $H_{18c}$, $W_{18a}$, $W_{18b}$, $W_{18c}$, and $W_{18d}$; each will be discussed in greater detail below.

Similar to panels 202, 204 that can be mounted to respective housings 106a,b, C'S panel 1700 and P'S panel 1800 can also be mounted to respective housings 106a,b, which can then be joined together through operation of respective S-channels 1706, 1816, as well as lower channel 1716 (of C'S panel 1700) and lower channel stop 1807b and lower edge 1814b (of P'S panel 1800), and become substantially immovably secured to each other through use of a set screw and set-screw hole 1714, according to aspects of the embodiments. That is, referring to FIGS. 29-34, it can be seen that P'S panel 1800 slides into C'S panel 1700 as indicated by arrows A and B of FIG. 34. Upper edge 1814a is shaped such that it fits within S-shaped channel 1706, and lower edge 1814b is shaped such that it fits within lower channel 1716; according to further aspects of the embodiments, sloped surface 1712 of panel 1700 is substantially similar in dimensions (slope angle and length or width) to that of sloped surface 1812 of panel 1800. Further shown in both of FIGS. 27 and 34 is set screw hole 1714, within which set screw 2402 can be inserted and used to tighten P'S panel 1800 against C'S panel 1700 to hold a first housing 106a against and in substantial alignment with second housing 106b. That is, as set screw 2402 is tightened within set screw hole 1714, it presses up and against a lower surface of panel edge lower 1814b, which forces P'S panel 1800 upwards such that an upper edge outer surface 1818a is forced against upper edge inner surface 1709 according to aspects of the embodiments. Further note that in order to mate C'S panel 1700 with P'S panel 1800, P'S panel 1800 must be inserted into C'S panel 1700 in a lengthwise direction i.e., in the direction of arrows A and B shown in FIG. 34. According to further aspects of the embodiments, each of sloped surfaces 1712, 1812 form first and second planar portions on their respective panels 1700, 1800. That is, for example, sloped surface 1712 extends from a first planar portion of panel 1700 and its termination point forms a second planar portion, wherein the first and second planar portions of panel 1700 formed by sloped surface 1712 are substantially parallel to each other; similarly sloped surface 1812 also forms first and second planar portions on panel 1800 that are also substantially parallel to each other, according to aspects of the embodiments.

To facilitate such mating of P'S panel 1800 with C'S panel 1700, certain ones of several dimensions of the respective panels 1800, 1700, are made substantially similar to one another. Height $H_{18a}$, the height from upper channel stop outer surface 1807 to upper edge outer surface 1818a, is substantially similar to height $H_{17a}$, the height of S-shaped channel 1706, which extends from upper lip inner surface 1707a to upper edge inner surface 1709. Height $H_{17b}$, the height from lower edge inner surface 1711 to upper lip inner surface 1707b, is sized to fit within height $H_{18b}$, the height from lower channel stop outer surface 1807b, to lower edge outer surface 1818b. Furthermore, height $H_{18c}$, the total height of P'S panel 1800 is made substantially similar (albeit, within a known or predetermined tolerance smaller) to the height of the interior portion of C'S panel 1700 $H_{17c}$. The height $H_{17c}$ extends from upper edge inner surface 1709, to lower edge inner surface 1711. The height $H_{18c}$ extends from upper edge outer surface 1818a, to lower edge outer surface 1818b. Further still, height $H_{18d}$, the height from upper channel stop outer surface 1807a, to lower channel stop outer surface 1807b, is sized to fit within height $H_{18d}$, the height from upper lip inner surface 1707a, lower lip inner surface 1707b. As can be seen in FIGS. 27-34, $W_{17a}$ is substantially similar to $W_{18a}$; $W_{17b}$ is substantially similar to $W_{18b}$; $W_{17c}$ is substantially similar to $W_{18c}$; and $W_{17d}$ is substantially similar to $W_{18d}$, such that panel 1800 can slide into panel 1700 according to aspects of the embodiments.

According to further aspects of the embodiments, panels 1700, 1800 can also be used to mount housings 106 to the sides of a rack mounting system, and can further comprise the sides as well, such that a series of housings 106 can be mounted to each other and to each side of a particular tray of a rack. As those of skill in the art can appreciate, housings 106 are typically of the same height, but have different widths, in order to fit within a vertical space of a tray of a rack. Even if the housings are of different heights, rack mounting system 200 can still be used to mount the housings 106 together and to the sides of the tray of the rack.

Figure 29:
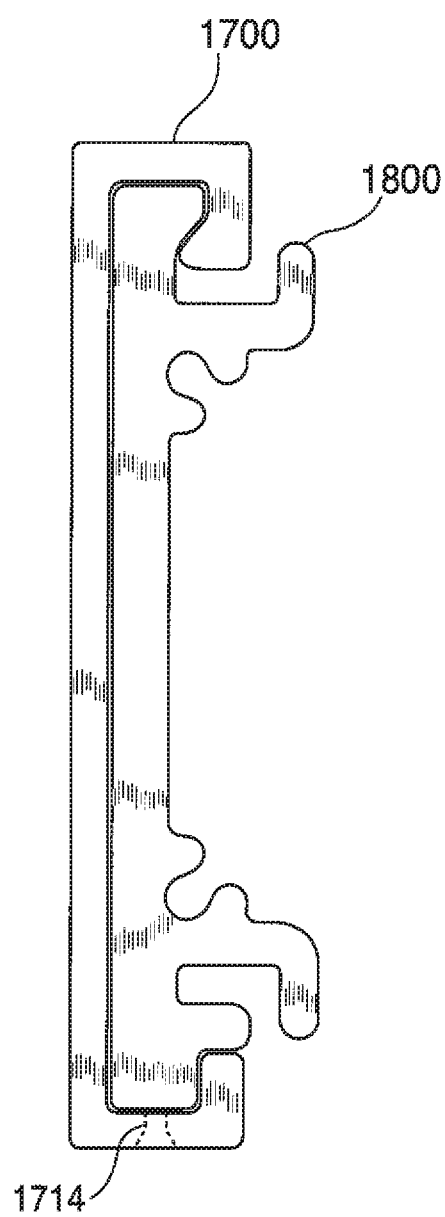
FIG. 29 illustrates a side view of a step in the assembly of two housings using the modified Pi-shaped sliding panel and the modified C-shaped sliding panel according to aspects of the embodiments.
Figure 30:
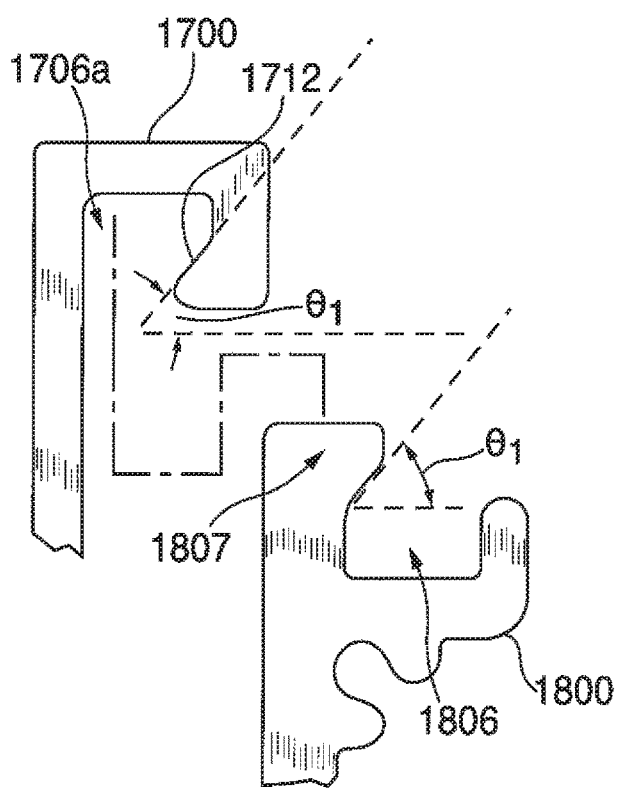
FIGS. 30 and 31 illustrate a close-up side view of the mating of upper portions of the modified Pi-shaped sliding panel and the modified C-shaped sliding panel according to aspects of the embodiments.
Figure 31:
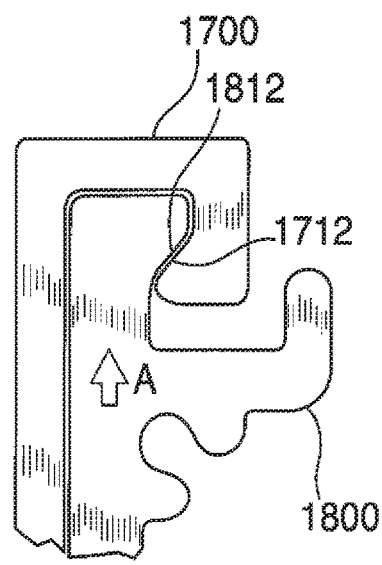

FIG. 29 illustrates a side view of a step in the assembly of two housings using C'S panel 1700 and P'S panel 1800 according to aspects of the embodiments. FIGS. 30 and 31 illustrate a close-up side view of the mating of upper portions of P'S panel 1800 and C'S panel 1700 according to aspects of the embodiments. As shown in FIGS. 30 and 31, the slope of each of sloped surfaces 1712, 1812 of C'S panel 1600 and P'S panel 1800 is substantially similar to each other, using an angle $\theta_1$. According to aspects of the embodiments, angle $\theta_1$ is about 55°, and can range from about 49.5° degrees to about 60.5°. When set screw 2402 is inserted in set-screw hole 1714, and screwed in an upward direction, such that it moves against lower edge outer surface 1818b, it pushes P'S panel 1800 in the direction of arrow A as shown in FIG. 31, such that the two panels 1700, 1800 are locked together, according to aspects of the embodiments.

Figure 32:
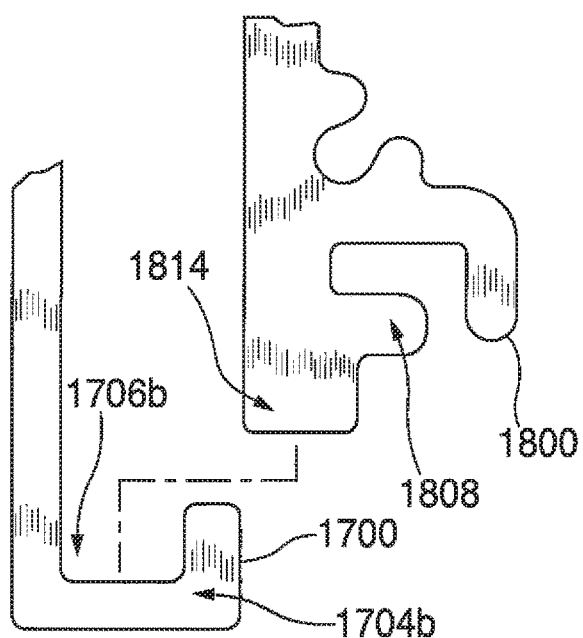
FIGS. 32 and 33 illustrate a close-up side view of the mating of lower portions of the modified Pi-shaped sliding panel and the modified C-shaped sliding panel according to aspects of the embodiments.
Figure 33:
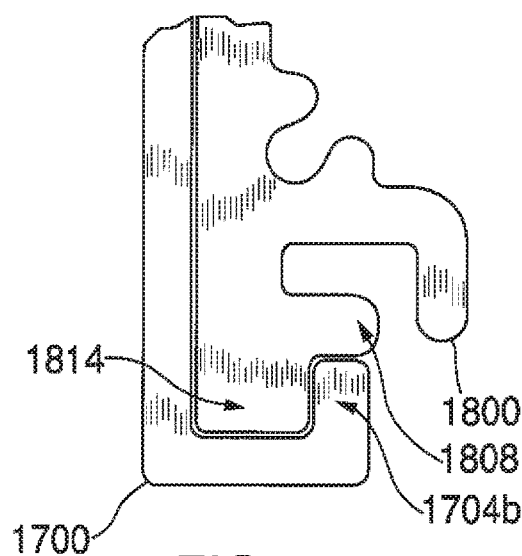
Figure 34:
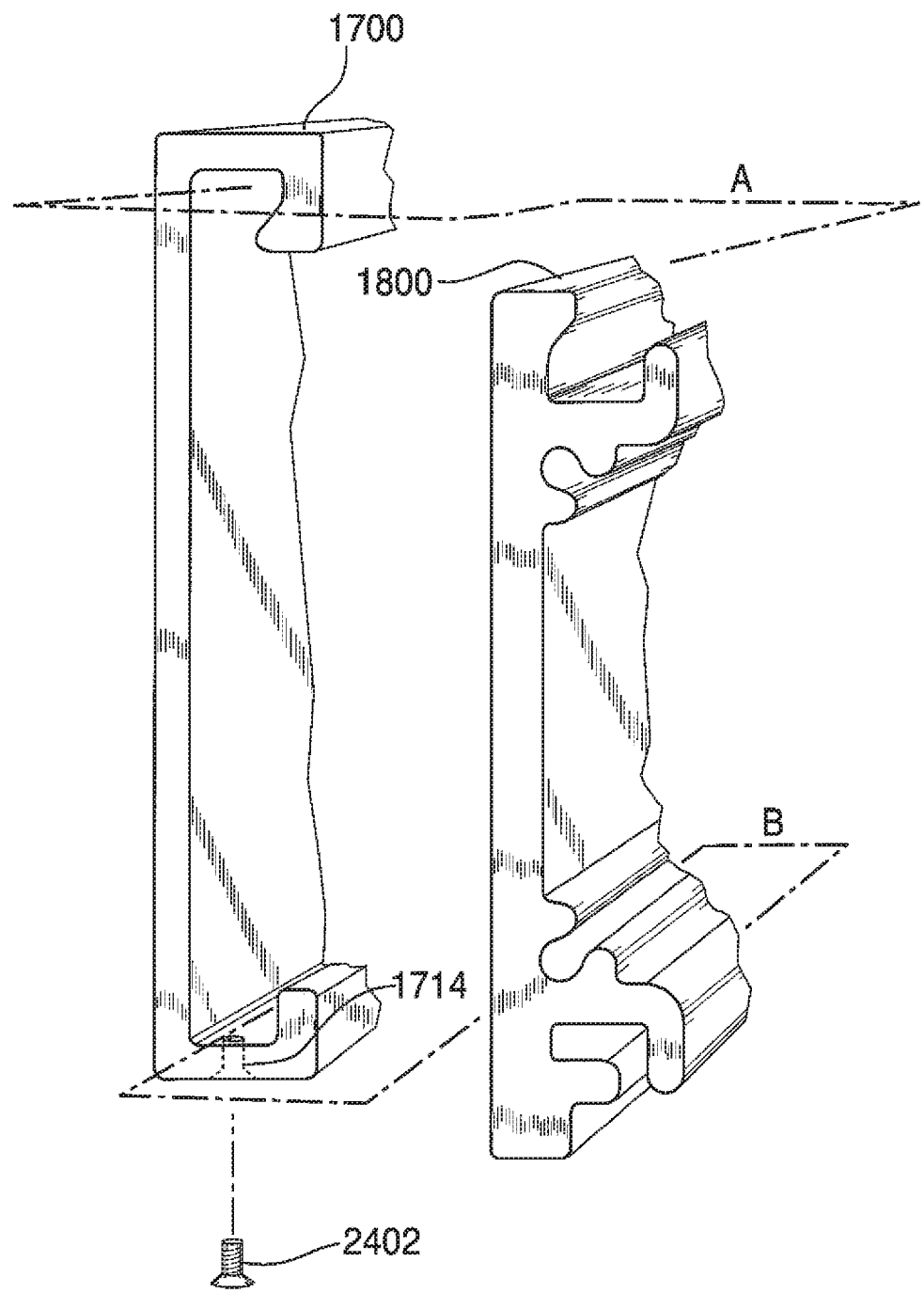
FIG. 34 illustrates a side perspective view of the mating of the modified Pi-shaped sliding panel and the modified C-shaped sliding panel according to aspects of the embodiments.

FIGS. 32 and 33 illustrate a close-up side view of the mating of lower portions of P'S panel 1800 and C'S panel 1700 according to aspects of the embodiments. FIG. 34 illustrates a side perspective view of the mating of P'S panel 1800 and C'S panel according to aspects of the embodiments.

The disclosed embodiments provide systems, modes, and methods for joining equipment housings together in a rack system. It should be understood that this description is not intended to limit the embodiments. On the contrary, the embodiments are intended to cover alternatives, modifications, and equivalents, which are included in the spirit and scope of the embodiments as defined by the appended claims. Further, in the detailed description of the embodiments, numerous specific details are set forth to provide a comprehensive understanding of the claimed embodiments. However, one skilled in the art would understand that various embodiments may be practiced without such specific details.

Although the features and elements of aspects of the embodiments are described being in particular combinations, each feature or element can be used alone, without the other features and elements of the embodiments, or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

The above-described embodiments are intended to be illustrative in all respects, rather than restrictive, of the embodiments. Thus, the embodiments are capable of many variations in detailed implementation that can be derived from the description contained herein by a person skilled in the art. No element, act, or instruction used in the description of the present application should be construed as critical or essential to the embodiments unless explicitly described as such. Also, as used herein, the article "a" is intended to include one or more items.

All United States patents and applications, foreign patents, and publications discussed above are hereby incorporated herein by reference in their entireties.

INDUSTRIAL APPLICABILITY

To solve the aforementioned problems, the aspects of the embodiments are directed towards systems, methods, and modes for joining equipment housings together in a rack system.

ALTERNATE EMBODIMENTS

Alternate embodiments may be devised without departing from the spirit or the scope of the different aspects of the embodiments.

What is claimed is:

1. A system for joining electronic equipment housings together in a rack apparatus, the system comprising:
   a first substantially planar panel (first panel) comprising
      a first edge,
      an opposing second edge (second edge),
      a first protruding channel stop placed a first distance away from, and substantially parallel to, the first edge,
      a second protruding channel stop placed a second distance away from, and substantially parallel to, the second edge; and
   a second substantially planar panel (second panel) comprising
      a first U-shaped lip channel adapted to slidingly engage and mate with the first protruding channel stop and the first edge of the first panel, and
      a second U-shaped lip channel adapted to slidingly engage and mate with the second protruding channel stop and the second edge of the first panel.

2. The system according to claim 1, wherein each of the first and second U-shaped lip channels comprise:
   a lip portion adapted to slidingly engage and fit onto respective first and second protruding channel stops.

3. The system according to claim 1, wherein the first panel is further adapted to be attached to a respective one of the housing.

4. The system according to claim 1, wherein the first panel is further adapted to be made part of a respective one of the housing.

5. The system according to claim 1, wherein the second panel is further adapted to be attached to a respective one of the housing.

6. The system according to claim 1, wherein the second panel is further adapted to be made part of a respective one of the housing.

7. The system according to claim 2, wherein
   each of the first and second protruding channel stops comprises a channel stop first surface extending from a first side of the first panel and having a first width, and
   each of the lip portions comprises a lip portion first surface having a second width that interfaces with respective channel stop first surfaces of the first and second protruding channel stops, and wherein
   the first width is substantially equal to the second width.

8. The system according to claim 7, wherein
   the first panel further comprises
      a first height that extends from an outer surface of respective ones of the first and second protruding channel stops to an outer surface of respective ones of the edges, and
   the second panel further comprises
      a depth of the U-shaped channel that is substantially equal to the first height, such that the portion of the first panel that corresponds to the first height fits in a slidingly engagingly manner within the U-shaped channel.

9. The system according to claim 1, wherein each of the first and second protruding channel stops is substantially perpendicular to the surface upon which the respective first and second protruding channel stop protrudes.

\* \* \* \* \*